(12) United States Patent
Matsubayashi

(10) Patent No.: US 9,230,648 B2
(45) Date of Patent: Jan. 5, 2016

(54) MEMORY DEVICE

(75) Inventor: Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 714 days.

(21) Appl. No.: 13/443,959

(22) Filed: Apr. 11, 2012

(65) Prior Publication Data

US 2012/0262979 A1 Oct. 18, 2012

(30) Foreign Application Priority Data

Apr. 15, 2011 (JP) .................................. 2011-091582
May 19, 2011 (JP) .................................. 2011-112453

(51) Int. Cl.
*G11C 15/00* (2006.01)
*G11C 15/04* (2006.01)

(52) U.S. Cl.
CPC ................ *G11C 15/04* (2013.01); *G11C 15/00* (2013.01); *G11C 15/046* (2013.01)

(58) Field of Classification Search
CPC ............. G11C 15/04; G11C 5/06; G11C 7/10
USPC ............... 365/72, 189.07, 49.1, 49.11, 49.12, 365/49.13, 50, 49.15, 49.16, 49.17, 49.18
See application file for complete search history.

(56) References Cited

U.S. PATENT DOCUMENTS

| 3,416,045 | A | * | 12/1968 | Zschauer et al. ............... 257/418 |
| 4,466,081 | A | | 8/1984 | Masuoka |
| 6,127,702 | A | | 10/2000 | Yamazaki et al. |
| 6,137,707 | A | * | 10/2000 | Srinivasan et al. ......... 365/49.15 |
| 6,522,562 | B2 | | 2/2003 | Foss |
| 2005/0135134 | A1 | * | 6/2005 | Yen et al. ......................... 365/49 |
| 2005/0152199 | A1 | * | 7/2005 | Park et al. ..................... 365/222 |
| 2009/0219739 | A1 | * | 9/2009 | Kim et al. .................. 365/49.17 |
| 2010/0067277 | A1 | * | 3/2010 | Chiang ....................... 365/49.17 |
| 2010/0148171 | A1 | | 6/2010 | Hayashi et al. |

FOREIGN PATENT DOCUMENTS

| JP | 63-096799 A | 4/1988 |
| JP | 07-121444 A | 5/1995 |
| JP | 2002-373493 A | 12/2002 |
| JP | 2004-295967 A | 10/2004 |

* cited by examiner

*Primary Examiner* — Son Dinh
*Assistant Examiner* — Uyen B Tran
(74) *Attorney, Agent, or Firm* — Fish & Richardson P.C.

(57) ABSTRACT

A memory device includes a memory cell storing data as stored data, an output signal line, and a wiring to which a voltage is applied. The memory cell includes a comparison circuit performing a comparison operation between the stored data and search data and taking a conduction state or a non-conduction state in accordance with the operation result, and a field-effect transistor controlling writing and holding of the stored data. A voltage of the output signal line is equal to the voltage of the wiring when the comparison circuit is in the conduction state.

9 Claims, 26 Drawing Sheets

| Dm | Dsch | Comp1 | Comp2 |
|---|---|---|---|
| (0) | (0) | × | pass |
| (1) | (0) | × | × |
| (0) | (1) | pass | pass |
| (1) | (1) | × | pass |

| Dm | Dsch | Comp1 | Comp2 |
|---|---|---|---|
| (0) | (0) | × | pass |
| (1) | (0) | pass | pass |
| (0) | (1) | × | × |
| (1) | (1) | × | pass |

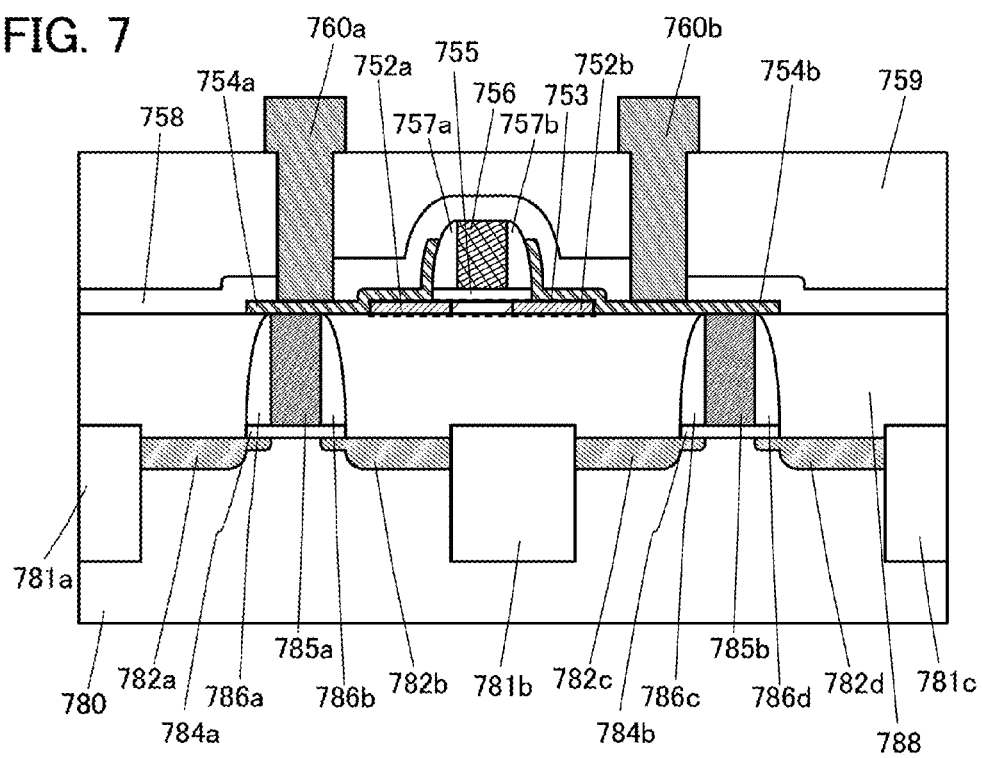

● In
○ Sn
◌ Zn
• O

FIG. 12A
FIG. 12B
FIG. 12C
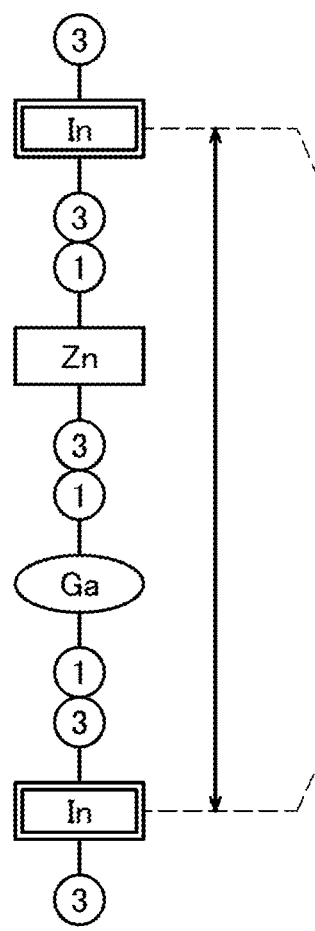
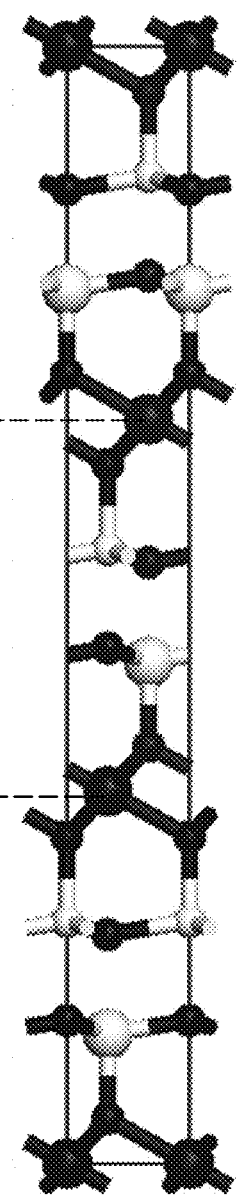
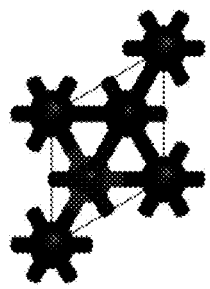
- In
- Ga
- Zn
- O

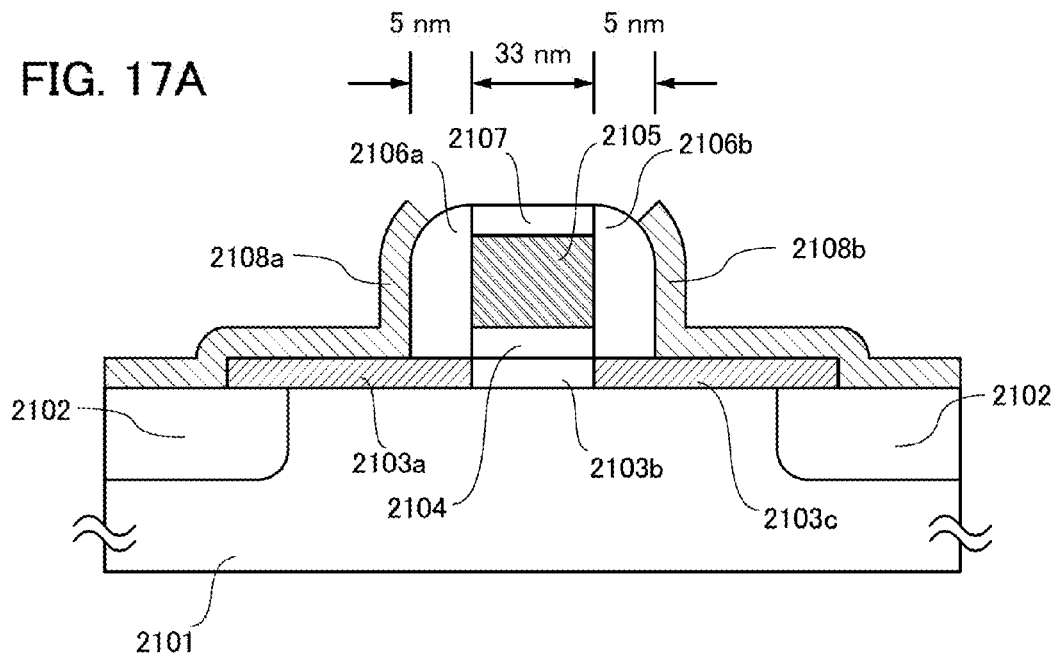
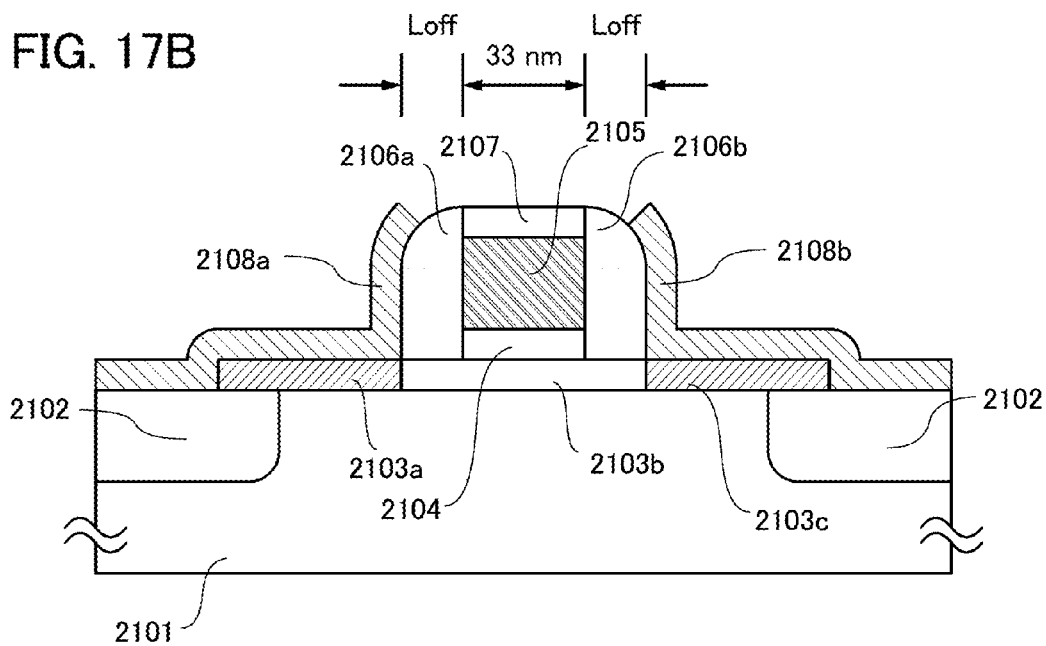

MEMORY DEVICE

BACKGROUND OF THE INVENTION

1. Field of the Invention

One embodiment of the present invention relates to a memory device.

2. Description of the Related Art

In recent years, memory devices capable of rewriting data have been developed.

As an example of such memory devices, a content addressable memory can be given.

The content addressable memory is a memory device capable of identifying data stored in a memory cell with respect to search data, in addition to rewriting data.

The content addressable memory is used for a set-associative cache memory for example. The set-associative structure is a data storage structure including a plurality of tags, and a content addressable memory is used as each of the tags. The use of the content addressable memory for the cache memory can increase the data communication speed between a CPU and the cache memory.

A memory cell in a content addressable memory includes, for example, a memory circuit which holds data and a plurality of comparison circuits which compare the data stored in the memory circuit with specific data (e.g., Patent Document 1).

In Patent Document 1, multi-bit data can also be identified by a level comparison circuit and a match detection circuit.

REFERENCE

Patent Document

[Patent Document 1] Japanese Published Patent Application No. 2004-295967

SUMMARY OF THE INVENTION

Conventional content addressable memories have a problem in that the circuit area in each memory cell is large. For example, in the content addressable memory disclosed in Patent Document 1, each memory cell includes as many as 11 transistors, which leads to a large circuit area.

In addition, conventional content addressable memories have a problem in that data stored in a memory cell in a holding state fluctuates owing to leakage current of a transistor in an off state. For example, in the content addressable memory disclosed in Patent Document 1, data is lost owing to leakage current of a transistor, or the like, when power supply is stopped. Accordingly, power needs to be kept supplied while data is held, which leads to an increase in power consumption.

An object of one embodiment of the present invention is to reduce a circuit area and/or to suppress fluctuation in data stored in a memory cell in a holding state.

In one embodiment of the present invention, a memory cell includes a comparison circuit which compares data stored in the memory cell with search data and a control transistor which controls setting of data stored in the memory cell, whereby the number of transistors in the memory cell is reduced and the circuit area is reduced.

In one embodiment of the present invention, a field-effect transistor which includes a channel formation layer including a wide gap semiconductor such as an oxide semiconductor is used as the control transistor, whereby leakage current of the control transistor in an off state is reduced; thus, fluctuation in data stored in the memory cell at the time when the control transistor is off is suppressed. Suppression of the fluctuation in data stored in the memory cell makes it possible to, for example, stop power supply as appropriate while data is held in the memory cell, which leads to a reduction in power consumption.

One embodiment of the present invention is a memory device including a memory cell storing data as stored data, an output signal line, and a wiring to which a voltage is applied. The memory cell includes a comparison circuit performing a comparison operation between the stored data and search data and taking a conduction state when the stored data is smaller than the search data and a non-conduction state when the stored data matches or is larger than the search data, and a field-effect transistor controlling writing and holding of the stored data. A voltage of the output signal line is equal to the voltage of the wiring when the comparison circuit is in the conduction state.

One embodiment of the present invention is a memory device including a memory cell storing data as stored data, an output signal line, and a wiring to which a voltage is applied. The memory cell includes a comparison circuit performing a comparison operation between the stored data and search data and taking a conduction state when the stored data is larger than the search data and a non-conduction state when the stored data matches or is smaller than the search data, and a field-effect transistor controlling writing and holding of the stored data. A voltage of the output signal line is equal to the voltage of the wiring when the comparison circuit is in the conduction state.

One embodiment of the present invention is a memory device including memory cells of N stages (N is a natural number greater than or equal to 2) each storing 1-bit data as stored data, a first output signal line, a second output signal line, a voltage supply line, and first to (N−1)th connection wirings. Each of the memory cells of N stages includes a first comparison circuit performing a first comparison operation between the 1-bit stored data and 1-bit search data and taking a conduction state when the 1-bit stored data is smaller than the 1-bit search data and a non-conduction state when the 1-bit stored data matches or is larger than the 1-bit search data, a second comparison circuit performing a second comparison operation between the 1-bit stored data and the 1-bit search data and taking a conduction state when the 1-bit stored data matches or is smaller than the 1-bit search data and a non-conduction state when the 1-bit stored data is larger than the 1-bit search data, and a field-effect transistor controlling writing and holding of the 1-bit stored data. The first comparison circuit of the memory cell in the first stage is configured to control electrical connection between the voltage supply line and the first output signal line by taking the conduction state or the non-conduction state. The second comparison circuit of the memory cell in the first stage is configured to control electrical connection between the voltage supply line and the first connection wiring by taking the conduction state or the non-conduction state. The first comparison circuit of the memory cell in the K-th stage (K is a natural number greater than or equal to 2 and less than or equal to N−1) is configured to control electrical connection between the (K−1)th connection wiring and the first output signal line by taking the conduction state or the non-conduction state. The second comparison circuit of the memory cell in the K-th stage is configured to control electrical connection between the (K−1)th connection wiring and the K-th connection wiring by taking the conduction state or the non-conduction state. The first comparison circuit of the memory cell in the N-th stage is configured to control electrical connection between the (N−1)th connection wiring and the first output signal line by taking the conduction state or the non-conduction state. The second comparison circuit of the memory cell in the N-th stage is configured to control electrical connection between the (N−1)th connection wiring and the second output signal line by taking the conduction state or the non-conduction state.

One embodiment of the present invention is a memory device including memory cells of N stages (N is a natural number greater than or equal to 2) each storing 1-bit data as stored data, a first output signal line, a second output signal line, a voltage supply line, and first to (N−1)th connection wirings. Each of the memory cells of N stages includes a first comparison circuit performing a first comparison operation between the 1-bit stored data and 1-bit search data and taking a conduction state when the 1-bit stored data is larger than the 1-bit search data and a non-conduction state when the 1-bit stored data matches or is smaller than the 1-bit search data, a second comparison circuit performing a second comparison operation between the 1-bit stored data and the 1-bit search data and taking a conduction state when the 1-bit stored data matches or is larger than the 1-bit search data and a non-conduction state when the 1-bit stored data is smaller than the 1-bit search data, and a field-effect transistor controlling writing and holding of the 1-bit stored data. The first comparison circuit of the memory cell in the first stage is configured to control electrical connection between the voltage supply line and the first output signal line by taking the conduction state or the non-conduction state. The second comparison circuit of the memory cell in the first stage is configured to control electrical connection between the voltage supply line and the first connection wiring by taking the conduction state or the non-conduction state. The first comparison circuit of the memory cell in the K-th stage (K is a natural number greater than or equal to 2 and less than or equal to N−1) is configured to control electrical connection between the (K−1)th connection wiring and the first output signal line by taking the conduction state or the non-conduction state. The second comparison circuit of the memory cell in the K-th stage is configured to control electrical connection between the (K−1)th connection wiring and the K-th connection wiring by taking the conduction state or the non-conduction state. The first comparison circuit of the memory cell in the N-th stage is configured to control electrical connection between the (N−1)th connection wiring and the first output signal line by taking the conduction state or the non-conduction state. The second comparison circuit of the memory cell in the N-th stage is configured to control electrical connection between the (N−1)th connection wiring and the second output signal line by taking the conduction state or the non-conduction state.

In any of the above embodiments of the present invention, the field-effect transistor may include an oxide semiconductor layer in which a channel is formed.

According to one embodiment of the present invention, the number of transistors in a memory cell can be reduced, whereby the circuit area can be reduced. Further, according to one embodiment of the present invention, fluctuation in data stored in a memory cell at the time when a control transistor is off can be suppressed.

BRIEF DESCRIPTION OF THE DRAWINGS

FIG. 7 illustrates a structural example of a memory device.
FIGS. 12A to 12C illustrate a crystal structure of an oxide material.
FIGS. 17A and 17B show cross-sectional structures of transistors used for calculation.

DETAILED DESCRIPTION OF THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the contents of the embodiments can be combined with each other as appropriate. In addition, the contents of the embodiments can be replaced with each other.

Further, the ordinal numbers such as "first" and "second" are used to avoid confusion between components and do not limit the number of each component.

Embodiment 1

In this embodiment, an example of a memory device capable of identifying stored data will be described.

The memory device in this embodiment includes a memory cell and an output signal line. The memory cell has a function of identifying stored data by performing comparison operation between the stored data and search data, and is provided in a memory cell array, for example. Note that the number of memory cells may be plural. 1-bit data can be used as each of the stored data and the search data. The output signal line is a wiring whose voltage is set in accordance with the comparison operation in the memory cell. The voltage of the output signal line serves as an output signal.

Further, an example of a memory cell will be described with reference to FIG. 1 and FIGS. 2A and 2B.

Figure 1:
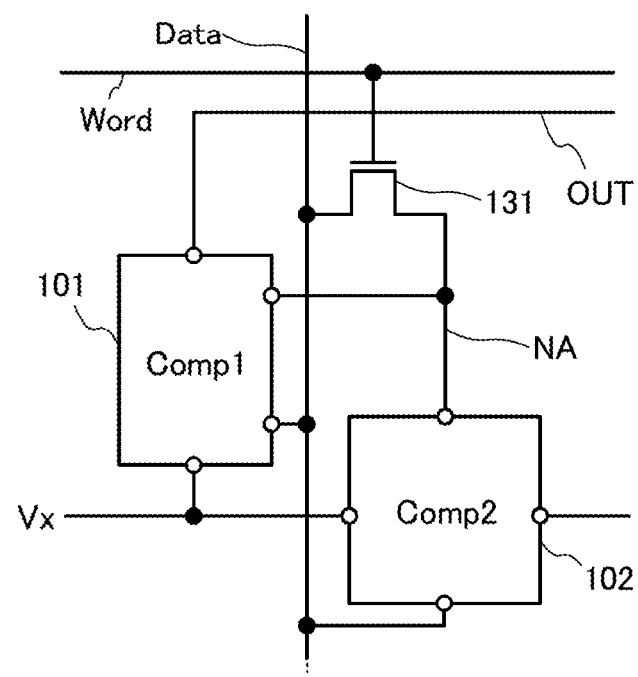
FIG. 1 illustrates an example of a memory device.
Figures 2A, 2B:
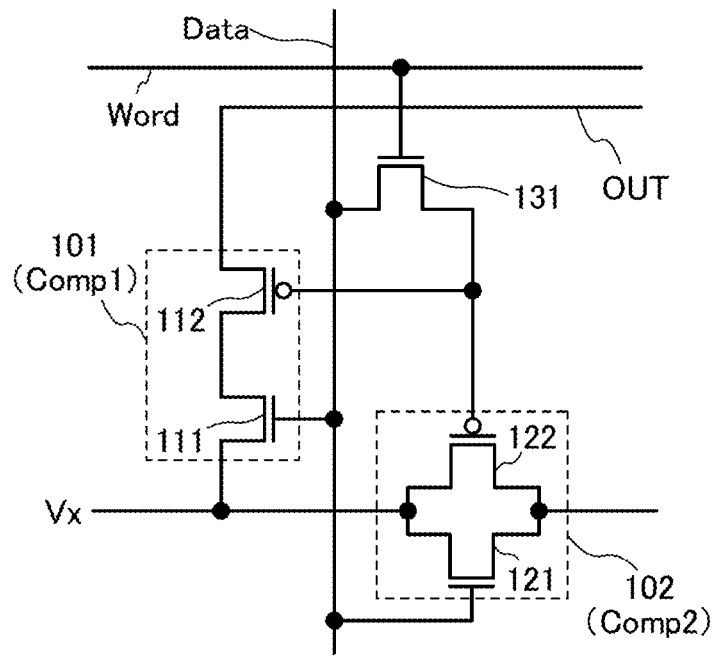
FIGS. 2A and 2B illustrate an example of a memory device.

As illustrated in FIG. 1 and FIG. 2A, the memory cell includes a comparison circuit 101 (also referred to as Comp1), a comparison circuit 102 (also referred to as Comp2), and a transistor 131. Note that the comparison circuit 102 is not necessarily provided; however, when the memory device includes a plurality of memory cells, for example, provision of the comparison circuit 102 enables the memory device to identify multi-bit data. In that case, the comparison circuit 102 controls the electrical continuity between the memory cell illustrated in FIG. 1 and FIG. 2A and another memory cell.

Note that a field-effect transistor can be used as the transistor, for example.

The comparison circuit 101 has a function of performing a first comparison operation using stored data (also referred to as data Dm) which is stored in the memory cell and search data (also referred to as data Dsch), and controlling whether to change the voltage of the output signal line OUT in accordance with the operation result. For example, the comparison circuit 101 has a function of changing the voltage of the output signal line OUT when the data Dm is smaller than the data Dsch or a function of changing the voltage of the output signal line OUT when the data Dm is larger than the data Dsch.

The comparison circuit 101 can be formed using a transistor. For example, the comparison circuit 101 includes a transistor 111 and a transistor 112, as illustrated in FIG. 2A. In this case, the transistor 111 is an n-channel transistor, and the transistor 112 is a p-channel transistor. A voltage Vx is applied to one of a source and a drain of the transistor 111, and the voltage of a gate of the transistor 111 serves as the data Dsch. One of a source and a drain of the transistor 112 is electrically connected to the other of the source and the drain of the transistor 111, the other of the source and the drain of the transistor 112 is electrically connected to the output signal line OUT, and the voltage of a gate of the transistor 112 serves as the data Dm.

The comparison circuit 102 has a function of performing a second comparison operation using the stored data (data Dm) which is stored in the memory cell and the search data (data Dsch).

The comparison circuit 102 can be formed using a transistor. For example, the comparison circuit 102 includes a transistor 121 and a transistor 122, as illustrated in FIG. 2A. In this case, the transistor 121 is an n-channel transistor, and the transistor 122 is a p-channel transistor. The voltage Vx is applied to one of a source and a drain of the transistor 121, and the voltage of a gate of the transistor 121 serves as the data Dsch. One of a source and a drain of the transistor 122 is electrically connected to the one of the source and the drain of the transistor 121, the other of the source and the drain of the transistor 122 is electrically connected to the other of the source and the drain of the transistor 121, and the voltage of a gate of the transistor 122 serves as the data Dm. The value of the voltage Vx is set as appropriate depending on the polarities of the transistors included in the comparison circuit 101 and the comparison circuit 102.

The transistor 131 has a function of controlling writing and holding of the data Dm. For example, a data signal is input to one of a source and a drain of the transistor 131, and the other of the source and the drain of the transistor 131 is electrically connected to the gate of the transistor 112 (the comparison circuit 101) and the gate of the transistor 122 (the comparison circuit 102). The transistor 131 is also referred to as a control transistor. Note that a capacitor may be provided in the memory cell, and one of a pair of electrodes of the capacitor may be electrically connected to the other of the source and the drain of the transistor 131. In that case, the voltage of the other of the pair of electrodes of the capacitor is set to a voltage equivalent to a ground potential or a given voltage.

As the transistor 131, for example, a transistor including an oxide semiconductor layer in which a channel is formed can be used. The band gap of the oxide semiconductor layer is larger than that of silicon and for example, 2 eV or more, preferably 2.5 eV or more, further preferably 3 eV or more.

Furthermore, the off-state current per micrometer of channel width of a transistor including the oxide semiconductor layer is as small as 10 aA ($1\times10^{-17}$ A) or less, preferably 1 aA ($1\times10^{-18}$ A) or less, more preferably 10 zA ($1\times10^{-20}$ A) or less, further preferably 1 zA ($1\times10^{-21}$ A) or less, still further preferably 100 yA ($1\times10^{-22}$ A) or less.

In addition, as illustrated in FIG. 1 and FIG. 2A, the memory device in this embodiment includes a data line Data and a word line Word, for example.

The data line Data is a wiring for transmission and reception of data to/from the memory cell. A data signal is input to the data line Data. For example, the data line Data illustrated in FIG. 2A is electrically connected to the gate of the transistor 111, the gate of the transistor 121, and the one of the source and the drain of the transistor 131. In this manner, the number of wirings can be reduced. Note that the one of the source and the drain of the transistor 131 may be electrically connected to a wiring other than the data line Data. In that case, a first data signal is input to the data line Data and a second data signal is input to the other wiring. The other wiring is also referred to as a bit line.

The word line Word is a wiring to which a signal which controls writing and holding of data in the memory cell is input. The word line Word is electrically connected to the gate of the transistor 131.

Voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

Next, as an example of a method for driving the memory device in this embodiment, an example of a method for driving the memory device illustrated in FIG. 2A is described. Here, for example, a binary digital signal which has a high level and a low level is used as the data signal, and the voltage Vx is set to be equal to the voltage of the high-level digital signal. Further, the voltage of the high-level data signal represents data (1), and the voltage of the low-level data signal represents data (0). Without limitation to this, the voltage of the high-level data signal may represent data (0) and the voltage of the low-level data signal may represent data (1).

In the example of the method for driving the memory device in this embodiment, first, the transistor 131 is turned on, and the voltage of the gates of the transistor 112 and the transistor 122, that is, the value of the data Dm is set by a data signal. Thus, data is written to the memory cell. After that, the transistor 131 is turned off, so that the voltage of the gates of the transistor 112 and the transistor 122 (the value of the data Dm) is held. Thus, data is stored in the memory cell. Note that the supply of the voltage Vx to the memory cell may be stopped at this time. Thus, power consumption can be reduced. For example, the supply of the voltage Vx can be controlled by a switch or the like.

Next, the voltage of the gates of the transistor 111 and the transistor 121, that is, the value of the data Dsch is set by a data signal.

At this time, the states of the comparison circuit 101 and the comparison circuit 102 change depending on the values of the data Dm and the data Dsch. Each state will be described with reference to FIG. 2B. FIG. 2B shows the values of the data Dm and the data Dsch and the states of the comparison circuit 101 and the comparison circuit 102.

As shown in FIG. 2B, when the value of the data Dm is (0) and the value of the data Dsch is data (1), that is, the data Dm is smaller than the data Dsch, the transistor 111 and the transistor 112 are turned on, so that the comparison circuit 101 is brought into a conduction state (also referred to as a state "pass"), and in other cases, at least one of the transistor 111 and the transistor 112 is turned off, so that the comparison circuit 101 is kept in a non-conduction state (also referred to as a state "x"). When the comparison circuit 101 is in the conduction state, the voltage of the output signal line OUT changes to be equal to the voltage Vx. When the comparison circuit 101 is in the non-conduction state, the voltage of the output signal line OUT does not change. Accordingly, it is possible to determine whether the data Dm is smaller than the data Dsch depending on whether the voltage of the output signal line OUT changes.

Further, when the value of the data Dm is (1) and the value of the data Dsch is data (0), that is, the data Dm is larger than the data Dsch, the transistor 121 and the transistor 122 are turned off, so that the comparison circuit 102 is kept in the non-conduction state, and in other cases, at least one of the transistor 121 and the transistor 122 is turned on, so that the comparison circuit 102 is brought into the conduction state. For example, in the case where the memory device includes a plurality of memory cells, when the comparison circuit 102 is in the conduction state, the memory cell including the comparison circuit 102 and another memory cell are electrically connected to each other, and when the comparison circuit 102 is in the non-conduction state, the memory cell including the comparison circuit 102 and the other memory cell are electrically disconnected to each other.

The above is the description of the example of the method for driving the memory device in this embodiment.

Figures 3A, 3B:
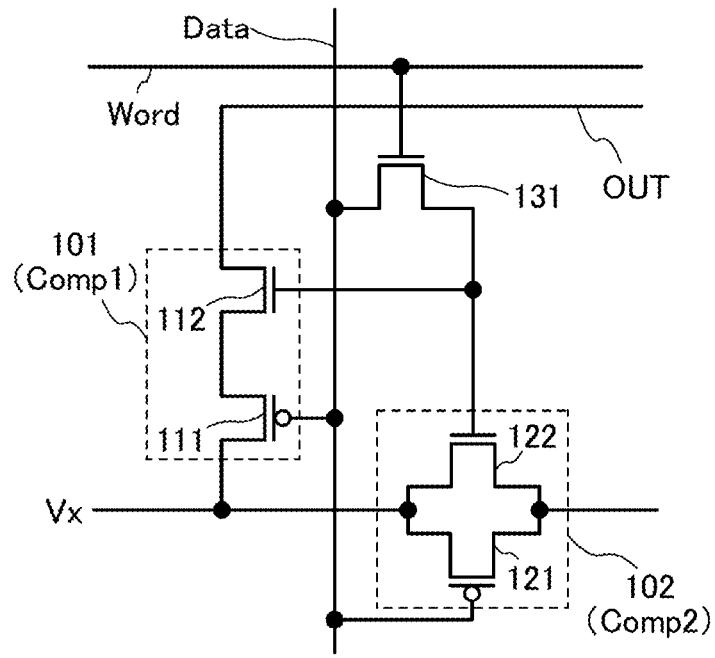
FIGS. 3A and 3B illustrate an example of a memory device.

Note that the configuration of the memory cell is not limited to that illustrated in FIG. 2A, and may be a configuration in which a p-channel transistor is used as the transistor 111, an n-channel transistor is used as the transistor 112, a p-channel transistor is used as the transistor 121, and an n-channel transistor is used as the transistor 122 as illustrated in FIG. 3A, for example. In that case, as shown in FIG. 3B, the comparison circuit 101 is brought into a conduction state when the data Dm is larger than the data Dsch and kept in a non-conduction state in other cases. Further, the comparison circuit 102 is kept in the non-conduction state when the data Dm is smaller than the data Dsch and brought into the conduction state in other cases. Accordingly, it is possible to determine whether the data Dm is larger than the data Dsch depending on whether the voltage of the output signal line OUT changes. Note that each of the comparison circuit 101 and the comparison circuit 102 may have any configuration, without limitation to those shown in FIG. 2A and FIG. 3A, as long as a function similar to the function of those shown in FIG. 2A or FIG. 3A can be performed.

As described with reference to FIG. 1, FIGS. 2A and 2B, and FIGS. 3A and 3B, in the example of the memory device in this embodiment, the memory cell capable of identifying data includes the comparison circuits and the control transistor that controls the setting of data stored in the memory cell, whereby the number of transistors in the memory cell can be reduced, resulting in a smaller circuit area.

In the example of the memory device in this embodiment, a transistor including an oxide semiconductor layer in which a channel is formed is used as the control transistor, whereby leakage current of the control transistor in an off state can be reduced. Thus, fluctuation in data stored in the memory cell at the time when the control transistor is off can be suppressed. Further, suppression of fluctuation in data stored in the memory cell makes it possible to stop power supply as appropriate while data is held in the memory cell, which leads to a reduction in power consumption.

Embodiment 2

In this embodiment, an example of a memory device capable of identifying multi-bit data will be described.

An example of a memory device in this embodiment is described with reference to FIG. 4.

Figure 4:
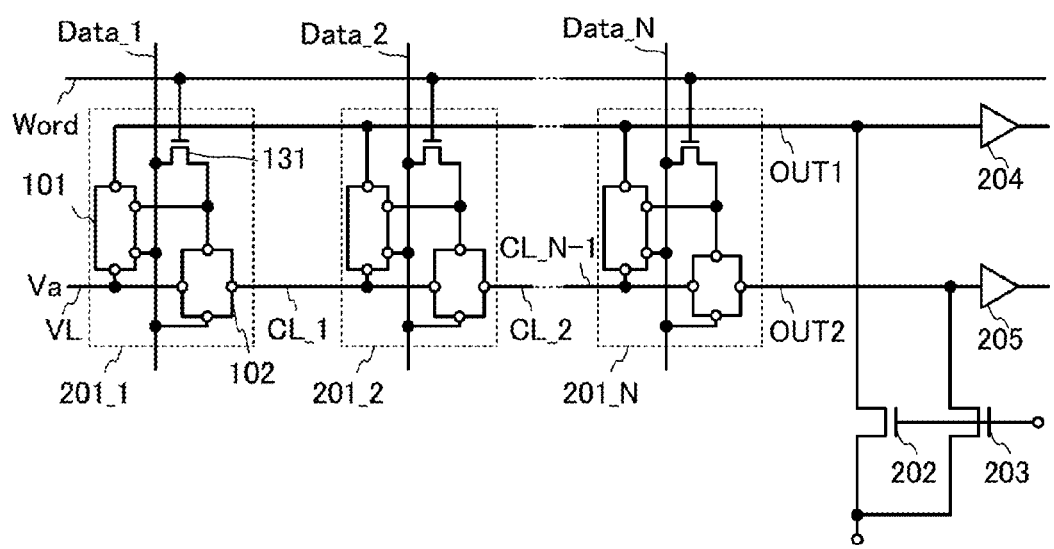
FIG. 4 illustrates an example of a memory device.

The memory device illustrated in FIG. 4 includes memory cells 201 (memory cells 201_1 to 201_N) of N stages (N is a natural number greater than or equal to 2), an output signal line OUT1, an output signal line OUT2, connection wirings CL_1 to CL_N−1, a wiring VL to which a voltage is applied, a transistor 202, a transistor 203, a buffer 204, and a buffer 205. Note that the memory device may include memory circuits of plural rows each including the memory cells 201 of N stages.

Each of the memory cells 201 of N stages can have the structure illustrated in FIG. 1 to include the comparison circuit 101, the comparison circuit 102, and the transistor 131. For example, each of the memory cells 201 of N stages stores 1-bit data as stored data.

In each of the memory cells 201 of N stages, the comparison circuit 101 has a function of performing a first comparison operation between 1-bit stored data (data Dm) and 1-bit search data (data Dsch), and controlling whether to change the voltage of the output signal line OUT1 in accordance with the operation result. For example, the comparison circuit 101 takes a conduction state when the data Dm is smaller than the data Dsch and takes a non-conduction state when the data Dm matches or is larger than the data Dsch. Without limitation to this, the comparison circuit 101 may take the conduction state when the data Dm is larger than the data Dsch and take the non-conduction state when the data Dm matches or is smaller than the data Dsch. The comparison circuit 101 (the other of the source and the drain of the transistor 112) is electrically connected to the output signal line OUT1.

Further, in each of the memory cells 201 of N stages, the comparison circuit 102 has a function of performing a second comparison operation between the 1-bit stored data (data Dm) and the 1-bit search data (data Dsch). For example, in the memory cell 201_K (K is a natural number greater than or equal to 2 and less than or equal to N−1) in the K-th stage, the comparison circuit 102 electrically disconnects the memory cell 201_K−1 in the (K−1)th stage and the memory cell 201_K+1 in the (K+1)th stage when the data Dm is smaller than the data Dsch, or electrically disconnects the memory cell 201_K−1 in the (K−1)th stage and the memory cell 201_K+1 in the (K+1)th stage when the data Dm is larger than the data Dsch. For example, the comparison circuit 102 takes a conduction state when the data Dm matches or is smaller than the data Dsch and takes a non-conduction state when the data Dm is larger than the data Dsch. Without limitation to this, the comparison circuit 102 may take the conduction state when the data Dm matches or is larger than the data Dsch and take the non-conduction state when the data Dm is smaller than the data Dsch. The comparison circuit 102 in the memory cell 201_K in the K-th stage is connected to the comparison circuit 102 in the memory cell 201_K−1 in the (K−1)th stage and the comparison circuit 102 in the memory cell 201_K+1 in the (K+1)th stage.

The comparison circuit 101 in the memory cell 201_1 in the first stage controls electrical connection between the wiring VL and the output signal line OUT1 by taking a conduction state or a non-conduction state.

The comparison circuit 102 in the memory cell 201_1 in the first stage controls electrical connection between the wiring VL and the first connection wiring CL_1 by taking a conduction state or a non-conduction state.

The comparison circuit 101 in the memory cell 201_K in the K-th stage controls electrical connection between the (K−1)th connection wiring CL_K−1 and the output signal line OUT1 by taking a conduction state or a non-conduction state.

The comparison circuit 102 in the memory cell 201_K in the K-th stage controls electrical connection between the (K−1)th connection wiring CL_K−1 and the K-th connection wiring CL_K by taking a conduction state or a non-conduction state.

The comparison circuit 101 in the memory cell 201_N in the N-th stage controls electrical connection between the (N−1)th connection wiring CL_N−1 and the output signal line OUT1 by taking a conduction state or a non-conduction state.

The comparison circuit 102 in the memory cell 201_N in the N-th stage controls electrical connection between the (N−1)th connection wiring CL_N−1 and the output signal line OUT2 by taking a conduction state or a non-conduction state.

In the memory cells 201 of N stages, respective ones of the sources and the drains of the transistors 131 are electrically connected to the respective data lines Data, through which respective data signals are input. The gates of the transistor 131 are electrically connected to a common word line Word.

In the memory cell 201_1 in the first stage, a voltage Va is applied to the comparison circuit 101 (the one of the source and the drain of the transistor 111) and the comparison circuit 102 (the one of the source and the drain of the transistor 121 and the one of the source and the drain of the transistor 122) through the wiring VL. Accordingly, the output signal line OUT2 is connected to the wiring to which the voltage Va is applied, through the comparison circuits 102 in the memory cells 201 of N stages. The voltage Va is set as appropriate depending on the polarities of the transistors included in each memory cell 201.

The output signal lines OUT1 and OUT2 are wirings whose voltages are set in accordance with the comparison operations in the memory cells 201 of N stages. The output signal line OUT2 is electrically connected to the memory cell 201_N in the N-th stage (the other of the source and the drain of the transistor 121 and the other of the source and the drain of the transistor 122).

Note that the description in Embodiment 1 can be referred to as appropriate for description of the other components.

The transistor 202 has a function of controlling whether to set the voltage of the output signal line OUT1 to a reference voltage. For example, the reference voltage is applied to one of a source and a drain of the transistor 202, the other of the source and the drain of the transistor 202 is electrically connected to the output signal line OUT1, and a control signal is input to a gate of the transistor 202. The value of the reference voltage is set as appropriate depending on the polarities of the transistors included in the memory device, for example.

The transistor 203 has a function of controlling whether to set the voltage of the output signal line OUT2 to a reference voltage. For example, the reference voltage is applied to one of a source and a drain of the transistor 203, the other of the source and the drain of the transistor 203 is electrically connected to the output signal line OUT2, and a control signal is input to a gate of the transistor 203. Note that the control signal and the reference voltage may be the same as those for the transistor 202.

The buffer 204 has a function of adjusting the voltage of the output signal line OUT1 and outputting the adjusted voltage as an output signal. Note that the buffer 204 is not necessarily provided.

The buffer 205 has a function of adjusting the voltage of the output signal line OUT2 and outputting the adjusted voltage as an output signal. Note that the buffer 205 is not necessarily provided.

Next, as an example of a method for driving the memory device in this embodiment, an example of a method for driving the memory device illustrated in FIG. 4 is described. Here, for example, a binary (1-bit) digital signal which has a high level and a low level is used as the data signal, and the voltage of the high-level data signal represents data (1) and the voltage of the low-level data signal represents data (0).

First, data is written to the memory cells 201_1 to 201_N by first to N-th data signals, respectively, so that the values of the data Dm stored in the memory cells 201 are set. Here, 1-bit data is written to each memory cell 201, so that N-bit data is written to the memory cells 201_1 to 201_N. At this time, the supply of the voltage Va to the memory cell 201_1 in the first stage may be stopped; thus, power consumption can be reduced. For example, the supply of the voltage Va can be controlled by a switch or the like.

Next, the transistor 202 is turned on, so that the voltages of the output signal lines OUT1 and OUT2 are set to the reference voltage.

Next, the values of the data Dsch in the memory cells 201_1 to 201_N are set by first to N-th data signals, respectively. 1-bit data is set as the data Dsch in each memory cell 201, whereby N-bit search data can be set in the memory cells 201_1 to 201_N.

At this time, the states of the comparison circuit 101 and the comparison circuit 102 change depending on the values of the data Dm and the data Dsch in each memory cell 201.

For example, when the data Dm is smaller than the data Dsch, the comparison circuit 101 is brought into a conduction state, and in other cases, the comparison circuit 101 is kept in a non-conduction state. When the comparison circuit 101 is in the conduction state, the voltage of the output signal line OUT1 changes. When the comparison circuit 101 is in the non-conduction state, the voltage of the output signal line OUT1 does not change.

Further, when the data Dm is larger than the data Dsch, the comparison circuit 102 is kept in a non-conduction state, and in other cases, the comparison circuit 102 is brought into a conduction state. For example, when the comparison circuit 102 in the memory cell 201_K in the K-th stage is in the conduction state, the memory cell 201_K in the K-th stage and the memory cell 201_K+1 in the (K+1)th stage are electrically connected to each other, and when the comparison circuit 102 in the memory cell 201_K in the K-th stage is in the non-conduction state, the memory cell 201_K in the K-th stage and the memory cell 201_K+1 in the (K+1)th stage are electrically disconnected to each other.

As described in the above operation example, when the N-bit data consisting of the stored data Dm stored in the memory cells 201 is larger, or smaller, than the N-bit data consisting of the data Dsch set in the memory cells 201, the voltage of the output signal line OUT1 changes, and in other cases, the voltage of the output signal line OUT1 does not change.

In addition, when the N-bit data consisting of the stored data Dm stored in the memory cells 201 is smaller, or larger, than the N-bit data consisting of the data Dsch set in the memory cells 201, the memory cells 201 in adjacent stages are electrically disconnected to each other, and when the N-bit data consisting of the stored data Dm stored in the memory cells 201 matches the N-bit data consisting of the data Dsch set in the memory cells 201, the voltage of the output signal line OUT2 changes.

Furthermore, the voltages of the output signal lines OUT1 and OUT2 are set by the comparison operations in the memory cells 201, whereby the N-bit data consisting of the data Dm stored in the memory cells 201 is identified.

For example, when the voltage of the output signal line OUT1 is a voltage representing data (1) and the voltage of the output signal line OUT2 is a voltage representing data (1) or data (0), it is determined that the N-bit data consisting of the data Dm stored in the memory cells 201 is smaller than the N-bit data serving as search data.

Further, when the voltage of the output signal line OUT1 is a voltage representing data (0) and the voltage of the output signal line OUT2 is a voltage representing data (1), it is determined that the N-bit data consisting of the data Dm stored in the memory cells 201 matches the N-bit data serving as search data. For example, when the data Dm matches the data Dsch in each of the memory cells 201 of N stages, the voltage of the output signal line OUT2 becomes a voltage representing data (1).

Further, when the voltage of the output signal line OUT1 is a voltage representing data (0) and the voltage of the output signal line OUT2 is a voltage representing data (0), it is determined that the N-bit data consisting of the data Dm stored in the memory cells 201 is larger than the N-bit data serving as search data.

Note that when the polarities of the transistors in the comparison circuit 101 and the comparison circuit 102 are changed in each memory cell 201 as in the memory device described in Embodiment 1 and the value of the voltage Va is changed, the magnitude relation between the voltages of the output signal lines OUT1 and OUT2 is reversed and the magnitude relation between the identification results is reversed.

As described above, the N-bit data consisting of the data Dm stored in the memory cells 201 can be identified depending on whether the voltages of the output signal lines OUT1 and OUT2 change.

In the case where the memory device includes a plurality of memory circuits each including the memory cells 201 of N stages, the data Dsch may be set concurrently in all the memory cells 201.

The above is the description of the example of the method for driving the memory device in this embodiment.

As described with reference to FIG. 4, a memory device may include memory cells of plural stages using the memory cell described in Embodiment 1, whereby the memory device capable of identifying multi-bit data can be provided.

Embodiment 3

In this embodiment, examples of a transistor including an oxide semiconductor layer which can be used for any of the memory devices in the above embodiments will be described.

Structure examples of the transistor including the oxide semiconductor layer are described with reference to FIGS. 5A to 5D. FIGS. 5A to 5D are schematic cross-sectional views each illustrating a structure example of the transistor in this embodiment.

Figure 5A:
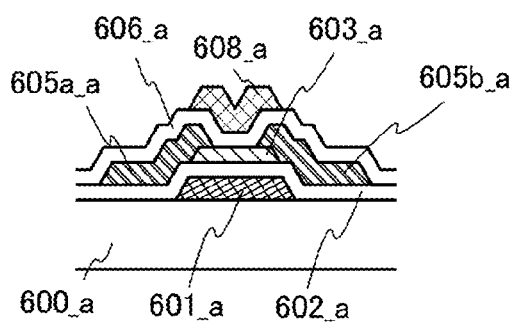
FIGS. 5A to 5D are cross-sectional schematic views each illustrating a structural example of a transistor.

A transistor shown in FIG. 5A includes a conductive layer 601_a, an insulating layer 602_a, a semiconductor layer 603_a, a conductive layer 605a_a, a conductive layer 605b_a, an insulating layer 606_a, and a conductive layer 608_a.

The conductive layer 601_a is provided over an element formation layer 600_a.

The insulating layer 602_a is provided over the conductive layer 601_a.

The semiconductor layer 603_a overlaps with the conductive layer 601_a with the insulating layer 602_a provided therebetween.

The conductive layer 605a_a and the conductive layer 605b_a are each provided over the semiconductor layer 603_a and electrically connected to the semiconductor layer 603_a.

The insulating layer 606_a is provided over the semiconductor layer 603_a, the conductive layer 605a_a, and the conductive layer 605b_a.

The conductive layer 608_a overlaps with the semiconductor layer 603_a with the insulating layer 606_a provided therebetween.

Note that one of the conductive layer 601_a and the conductive layer 608_a is not necessarily provided. In the case where the conductive layer 608_a is not provided, the insulating layer 606_a is not necessarily provided.

Figure 5C:
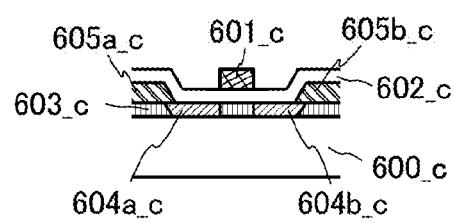
Figure 5B:
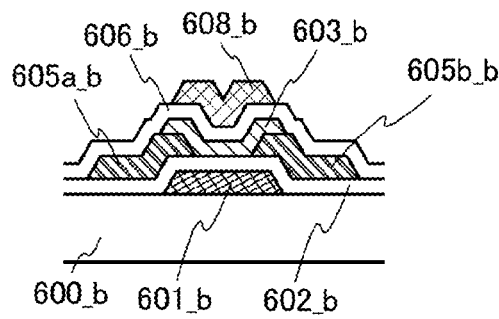

A transistor shown in FIG. 5B includes a conductive layer 601_b, an insulating layer 602_b, a semiconductor layer 603_b, a conductive layer 605a_b, a conductive layer 605b_b, an insulating layer 606_b, and a conductive layer 608_b.

The conductive layer 601_b is provided over an element formation layer 600_b.

The insulating layer 602_b is provided over the conductive layer 601_b.

The conductive layer 605a_b and the conductive layer 605b_b are each provided over part of the insulating layer 602_b.

The semiconductor layer 603_b is provided over the conductive layer 605a_b and the conductive layer 605b_b and electrically connected to the conductive layer 605a_b and the conductive layer 605b_b. Further, the semiconductor layer 603_b overlaps with the conductive layer 601_b with the insulating layer 602_b provided therebetween.

The insulating layer 606_b is provided over the semiconductor layer 603_b, the conductive layer 605a_b, and the conductive layer 605b_b.

The conductive layer 608_b overlaps with the semiconductor layer 603_b with the insulating layer 606_b provided therebetween.

Note that one of the conductive layer 601_b and the conductive layer 608_b is not necessarily provided. In the case where the conductive layer 608_b is not provided, the insulating layer 606_b is not necessarily provided.

A transistor shown in FIG. 5C includes a conductive layer 601_c, an insulating layer 602_c, a semiconductor layer 603_c, a conductive layer 605a_c, and a conductive layer 605b_c.

The semiconductor layer 603_c includes a region 604a_c and a region 604b_c. The region 604a_c and the region 604b_c are separated from each other and a dopant is added to each of the regions. A region between the region 604a_c and the region 604b_c serves as a channel formation region. The semiconductor layer 603_c is provided over an element formation layer 600_c. Note that it is not necessary to provide the region 604a_c and the region 604b_c.

The conductive layer 605a_c and the conductive layer 605b_c are provided over the semiconductor layer 603_c and electrically connected to the semiconductor layer 603_c. Side surfaces of the conductive layer 605a_c and the conductive layer 605b_c are tapered.

The conductive layer 605a_c overlaps with part of the region 604a_c; however, the present invention is not necessarily limited to this. When the conductive layer 605a_c partly overlaps with the region 604a_c, resistance between the conductive layer 605a_c and the region 604a_c can be low. Further, an entire region in the semiconductor layer 603_c, which overlaps with the conductive layer 605a_c may be the region 604a_c.

The conductive layer 605b_c overlaps with part of the region 604b_c; however, the present invention is not limited to this. When the conductive layer 605b_c partly overlaps with the region 604b_c, resistance between the conductive layer 605b_c and the region 604b_c can be low. Further, an entire region in the semiconductor layer 603_c, which overlaps with the conductive layer 605b_c may be the region 604b_c.

The insulating layer 602_c is provided over the semiconductor layer 603_c, the conductive layer 605a_c, and the conductive layer 605b_c.

The conductive layer 601_c overlaps with the semiconductor layer 603_c with the insulating layer 602_c provided therebetween. A region in the semiconductor layer 603_c, which overlaps with the conductive layer 601_c with the insulating layer 602_c provided therebetween serves as the channel formation region.

Figure 5D:
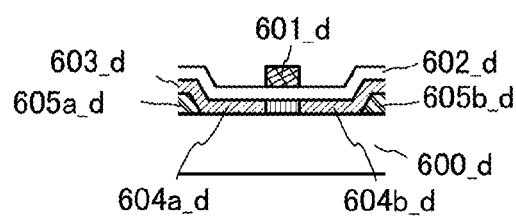

A transistor shown in FIG. 5D includes a conductive layer 601_d, an insulating layer 602_d, a semiconductor layer 603_d, a conductive layer 605a_d, and a conductive layer 605b_d.

The conductive layer 605a_d and the conductive layer 605b_d are provided over an element formation layer 600_d. Side surfaces of the conductive layer 605a_d and the conductive layer 605b_d are tapered.

The semiconductor layer 603_d includes a region 604a_d and a region 604b_d. The region 604a_d and the region 604b_d are separated from each other and a dopant is added to each of the regions. A region between the region 604a_d and the region 604b_d serves as a channel formation region. The semiconductor layer 603_d is provided over the conductive layer 605a_d, the conductive layer 605b_d, and the element formation layer 600_d and electrically connected to the conductive layer 605a_d and the conductive layer 605b_d. Note that the region 604a_d and the region 604b_d are not necessarily provided.

The region 604a_d is electrically connected to the conductive layer 605a_d.

The region 604b_d is electrically connected to the conductive layer 605b_d.

The insulating layer 602_d is provided over the semiconductor layer 603_d.

The conductive layer 601_d overlaps with the semiconductor layer 603_d with the insulating layer 602_d provided therebetween. A region in the semiconductor layer 603_d, which overlaps with the conductive layer 601_d with the insulating layer 602_d provided therebetween serves as the channel formation region.

Further, components illustrated in FIGS. 5A to 5D are described.

As the element formation layers 600_a to 600_d, insulating layers, substrates having insulating surfaces, or the like can be used, for example. Further, layers over which elements are formed in advance can be used as the element formation layers 600_a to 600_d.

Each of the conductive layers 601_a to 601_d has a function of a gate of the transistor. Note that a layer functioning as a gate of a transistor is also referred to as a gate electrode or a gate wiring.

Each of the conductive layers 601_a to 601_d can be, for example, a layer of a metal material such as molybdenum, magnesium, titanium, chromium, tantalum, tungsten, aluminum, copper, neodymium, or scandium or an alloy material containing any of these materials as a main component. The conductive layers 601_a to 601_d can also be formed by stacking layers of materials that can be used for the conductive layers 601_a to 601_d.

Each of the insulating layers 602_a to 602_d has a function of a gate insulating layer of the transistor.

Each of the insulating layers 602_a to 602_d can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. The insulating layers 602_a to 602_d can also be formed by stacking layers of materials that can be used for the insulating layers 602_a to 602_d.

Alternatively, as each of the insulating layers 602_a to 602_d, an insulating layer of a material containing an element that belongs to Group 13 in the periodic table and oxygen can be used, for example. When the semiconductor layers 603_a to 603_d contain an element that belongs to Group 13, the use of insulating layers each containing an element that belongs to Group 13 as insulating layers in contact with the semiconductor layers 603_a to 603_d makes the state of interfaces between the insulating layers and the oxide semiconductor layers favorable.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For the insulating layers 602_a to 602_d, a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$ ($x$ is larger than 0 and smaller than 2 and $\alpha$ is larger than 0 and smaller than 1) can be used, for example.

The insulating layers 602_a to 602_d can also be formed by stacking layers of materials that can be used for the insulating layers 602_a to 602_d. For example, the insulating layers 602_a to 602_d can be a stack of layers containing gallium oxide represented by $Ga_2O_x$. Alternatively, the insulating layers 602_a to 602_d may be a stack of layers of an insulating layer containing gallium oxide represented by $Ga_2O_x$ and an insulating layer containing aluminum oxide represented by $Al_2O_x$.

Each of the semiconductor layers 603_a to 603_d functions as a layer in which a channel of the transistor is formed. Examples of an oxide semiconductor that can be used for the semiconductor layers 603_a to 603_d include a four-component metal oxide, a three-component metal oxide, a two-component metal oxide, and a single-component metal oxide.

An oxide semiconductor preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the four-component metal oxide, an In—Sn—Ga—Zn—O-based metal oxide, an In—Hf—Ga—Zn—O-based metal oxide, an In—Al—Ga—Zn—O-based metal oxide, an In—Sn—Al—Zn—O-based metal oxide, an In—Sn—Hf—Zn—O-based metal oxide, an In—Hf—Al—Zn—O-based metal oxide, or the like can be used.

As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Hf—Zn—O-based metal oxide, an In—La—Zn—O-based metal oxide, an In—Ce—Zn—O-based metal oxide, an In—Pr—Zn—O-based metal oxide, an In—Nd—Zn—O-based metal oxide, an In—Sm—Zn—O-based metal oxide, an In—Eu—Zn—O-based metal oxide, an In—Gd—Zn—O-based metal oxide, an In—Tb—Zn—O-based metal oxide, an In—Dy—Zn—O-based metal oxide, an In—Ho—Zn—O-based metal oxide, an In—Er—Zn—O-based metal oxide, an In—Tm—Zn—O-based metal oxide, an In—Yb—Zn—O-based metal oxide, an In—Lu—Zn—O-based metal oxide, or the like can be used, for example.

As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, an In—Ga—O-based metal oxide, or the like can be used, for example.

As the single-component metal oxide, for example, an In—O-based metal oxide, a Sn—O-based metal oxide, a Zn—O-based metal oxide, or the like can be used. Further, the metal oxide that can be used as the oxide semiconductor may contain silicon oxide.

Note that an In—Ga—Zn—O-based metal oxide refers to a metal oxide whose main components are In, Ga, and Zn, and there is no particular limitation on the ratio of In:Ga:Zn. The In—Ga—Zn—O-based metal oxide may contain a metal element other than the In, Ga, and Zn.

In the case where an In—Zn—O-based metal oxide is used, for example, an oxide target having the following composition ratios can be used for formation of an In—Zn—O-based metal oxide semiconductor layer: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when the atomic ratio of the target used for the formation of the In—Zn—O-based oxide semiconductor is expressed by In:Zn:O=S:U:R, R>1.5S+U. The increase in the In content can make the mobility of the transistor higher.

Further, in the case of an In—Sn—Zn—O-based metal oxide, an oxide target having a composition ratio of In:Sn:Zn=1:2:2, In:Sn:Zn=2:1:3, In:Sn:Zn=1:1:1, In:Sn:Zn=20:45:35, or the like in atomic ratio is used.

Alternatively, as the oxide semiconductor, a material represented by $InLO_3(ZnO)_m$, (m is larger than 0 and is not an integer) can be used. Here, L in $InLO_3(ZnO)_m$ represents one or more metal elements selected from Ga, Fe, Al, Mn, and Co. As the oxide semiconductor, a material represented by $In_3SnO_5(ZnO)_n$ (n is larger than 0 and is an integer) can also be used.

Further, an In—Ga—Zn—O-based metal oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn—O-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, high mobility can be obtained relatively easily in the case where the In—Sn—Zn—O-based metal oxide is used. However, the mobility can be increased by reducing the defect density in the bulk also in the case where the In—Ga—Zn—O-based metal oxide is used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| \, dx \, dy \quad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM). Note that the measurement plane is a plane which is shown by all the measurement data, and the measurement data consists of three parameters (x, y, z) and is represented by z=F(x, y). The range of x (and y) is from 0 to $x_{max}$ (and $y_{max}$), and the range of z is from $z_{min}$ to $z_{max}$.

At least regions of the semiconductor layers 603_a to 603_d, in which the channels are formed may be crystalline and non-single-crystal and include a phase which has a triangular, hexagonal, regular triangular, or regular hexagonal atomic arrangement when seen from the direction perpendicular to the a-b plane and in which metal atoms are arranged in a layered manner in the direction perpendicular to the c-axis direction or the metal atoms and oxygen atoms are arranged in a layered manner in the direction perpendicular to the c-axis direction. Note that the material having the phase is also referred to as a c-axis aligned crystal (CAAC).

When the channel length of the transistor is set to 30 nm, the thickness of each of the semiconductor layers 603_a to 603_d may be set to about 5 nm, for example. In this case, when the semiconductor layers 603_a to 603_d are oxide semiconductor layers including CAAC, short-channel effect in the transistor can be suppressed.

A dopant imparting n-type or p-type conductivity is added to each of the region 604a_c, the region 604b_c, the region 604a_d, and the region 604b_d, and the region 604a_c, the region 604b_c, the region 604a_d, and the region 604b_d each function as a source or a drain of the transistor. As the dopants, for example, one or more of elements of Group 13 in the periodic table (e.g., boron), of Group 15 in the periodic table (e.g., one or more of nitrogen, phosphorus, and arsenic), and of rare gas (e.g., one or more of helium, argon, and xenon) can be used. A region functioning as a source of a transistor is also referred to as a source region, and a region functioning as a drain of a transistor is also referred to as a drain region. By addition of the dopant to the region 604a_c, 604b_c, 604a_d, 604b_d, connection resistance between the region and the conductive layer can be reduced, resulting in miniaturization of the transistor.

The conductive layers 605a_a to 605a_d and the conductive layers 605b_a to 605b_d each function as a source or a drain of the transistor. Note that a layer functioning as a source of a transistor is also referred to as a source electrode or a source wiring, and a layer functioning as a drain of a transistor is also referred to as a drain electrode or a drain wiring.

Each of the conductive layers 605a_a to 605a_d and the conductive layers 605b_a to 605b_d can be, for example, a layer of a metal material such as aluminum, magnesium, chromium, copper, tantalum, titanium, molybdenum, or tungsten; or an alloy material which contains any of the above metal materials as a main component. For example, each of the conductive layers 605a_a to 605a_d and the conductive layers 605b_a to 605b_d can be formed using a layer of an alloy material containing copper, magnesium, and aluminum. Alternatively, each of the conductive layers 605a_a to 605a_d and the conductive layers 605b_a to 605b_d can be formed by stacking layers of materials that can be used for the conductive layers 605a_a to 605a_d and the conductive layers 605b_a to 605b_d. For example, each of the conductive layers 605a_a to 605a_d and the conductive layers 605b_a to 605b_d can be formed using a stack of a layer of an alloy material containing copper, magnesium, and aluminum and a layer containing copper.

Alternatively, each of the conductive layers 605a_a to 605a_d and the conductive layers 605b_a to 605b_d can be a layer containing a conductive metal oxide. Examples of the conductive metal oxide include indium oxide, tin oxide, zinc oxide, indium oxide-tin oxide, and indium oxide-zinc oxide. Note that the conductive metal oxide that can be used for each of the conductive layers 605a_a to 605a_d and the conductive layers 605b_a to 605b_d may contain silicon oxide.

Each of the insulating layers 606_a and 606_b can be a layer of a material that can be used for the insulating layers 602_a to 602_d. Alternatively, the insulating layers 606_a and 606_b may be formed by stacking layers of materials that can be used for the insulating layers 606_a and 606_b. For example, each of the insulating layers 606_a and 606_b may be formed using a silicon oxide layer, an aluminum oxide layer, or the like. For example, application of an aluminum oxide layer to the insulating layers 606_a and 606_b can more effectively prevent an impurity from entering the semiconductor layers 603_a and 603_b and effectively prevent the semiconductor layers 603_a and 603_b from releasing oxygen.

Each of the conductive layers 608_a and 608_b functions as a gate of the transistor. Note that when the transistor includes both the conductive layers 601_a and 608_a or both the conductive layers 601_b and 608_b, one of the conductive layers 601_a and 608_a or one of the conductive layers 601_b and 608_b is referred to as a back gate, a back gate electrode, or a back gate wiring. A plurality of conductive layers each functioning as a gate is provided with the channel formation layer provided therebetween, whereby the threshold voltage of the transistor can be easily controlled.

Each of the conductive layers 608_a and 608_b can be, for example, a layer of a material that can be used for the conductive layers 601_a to 601_d. Alternatively, the conductive layers 608_a and 608_b may be formed by stacking layers of materials that can be used for the conductive layers 608_a and 608_b.

Note that the transistor of this embodiment may have an insulating layer over a part of the oxide semiconductor layer serving as a channel formation layer and include a conductive layer serving as a source or a drain and overlapping with the oxide semiconductor layer with the insulating layer therebetween. In the above structure, the insulating layer functions as a layer protecting the channel formation layer (also referred to as a channel protective layer) of the transistor. As the insulating layer functioning as a channel protective layer, a layer of a material that can be used for the insulating layers 602_a to 602_d can be used, for example. The insulating layer functioning as a channel protective layer may be formed by stacking layers of materials that can be used for the insulating layers 602_a to 602_d.

Alternatively, base layers may be formed over the element formation layers 600_a to 600_d and the transistors may be formed over the base layers. In that case, the base layer can be a layer of a material that can be used for the insulating layers 602_a to 602_d, for example. The base layer may be formed by stacking layers of materials that can be used for the insulating layers 602_a to 602_d. For example, a base layer formed using a stack of an aluminum oxide layer and a silicon oxide layer can prevent the base layer from releasing oxygen through the semiconductor layers 603_a to 603_d.

As an example of a method for forming the transistor in this embodiment, an example of a method for forming the transistor illustrated in FIG. 5A is described with reference to FIGS. 6A to 6E. FIGS. 6A to 6E are schematic cross-sectional views illustrating the example of the method for forming the transistor in FIG. 5A.

Figure 6A:
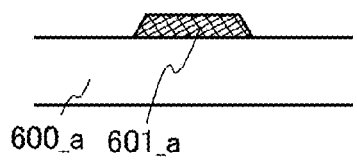
FIGS. 6A to 6E are cross-sectional schematic views illustrating an example of a method for manufacturing a transistor.

First, as shown in FIG. 6A, the element formation layer 600_a is prepared, a first conductive film is formed over the element formation layer 600_a, and part of the first conductive film is etched to form the conductive layer 601_a.

For example, a film of a material that can be used for the conductive layer 601_a is formed by sputtering, so that the first conductive film can be formed. The first conductive film can also be formed by stacking layers of materials that can be used for the first conductive film.

When a high-purity gas from which impurities such as hydrogen, water, a hydroxyl group, or hydride are removed is used as a sputtering gas, the impurity concentration of a film to be formed can be reduced.

Note that before the film is formed by sputtering, preheat treatment may be performed in a preheating chamber of a sputtering apparatus. By the preheat treatment, impurities such as hydrogen or moisture can be eliminated.

Moreover, before the film is formed by sputtering, it is possible to perform the following treatment (called reverse sputtering): instead of applying a voltage to the target side, an RF power source is used for applying a voltage to the substrate side in an argon, nitrogen, helium, or oxygen atmosphere so that plasma is generated to modify a surface where the film is to be formed. With reverse sputtering, powdery substances (also referred to as particles or dust) attached to the surface where the film is to be formed can be removed.

In the case where the film is formed by sputtering, moisture remaining in a deposition chamber used for forming the film can be removed with an entrapment vacuum pump or the like. As the entrapment vacuum pump, a cryopump, an ion pump, or a titanium sublimation pump can be used, for example. Alternatively, moisture remaining in the deposition chamber can be removed by a turbo molecular pump provided with a cold trap. With the use of the above vacuum pump, counter flow of exhaust including impurities can be reduced.

As in the method for forming the conductive layer 601_a, the example of the method for forming the transistor of this embodiment employs, for example, the following steps in order to form a layer by etching part of a film: a resist mask is formed over part of the film by a photolithography process and the film is etched using the resist mask, thereby forming the layer. Note that in this case, the resist mask is removed after the layer is formed.

Note that the resist mask may be formed by an inkjet method. A photomask is not used in an inkjet method; thus, manufacturing cost can be reduced. Alternatively, the resist mask may be formed using a light-exposure mask having a plurality of regions with different transmittances (also referred to as a multi-tone mask). With a multi-tone mask, a resist mask having different thicknesses can be formed, and the number of resist masks used for manufacturing the transistor can be reduced.

Figure 6B:
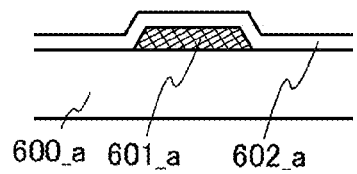

Next, as shown in FIG. 6B, a first insulating film is formed over the conductive layer 601_a, so that the insulating layer 602_a is formed.

For example, a film of a material that can be used for the insulating layer 602_a is formed by sputtering, plasma CVD, or the like, so that the first insulating film can be formed. The first insulating film can also be formed by stacking layers of materials that can be used for the insulating layer 602_a. Moreover, when a film of a material that can be used for the insulating layer 602_a is formed by high-density plasma CVD (e.g., high-density plasma CVD using microwaves such as microwave at a frequency of 2.45 GHz), the insulating layer 602_a can be dense and have an improved breakdown voltage.

Figure 6C:
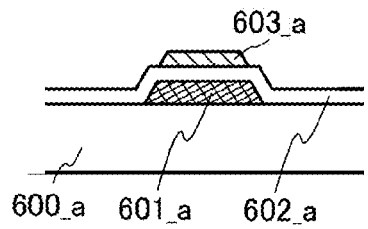

Next, an oxide semiconductor film is formed over the insulating layer 602_a and then part of the oxide semiconductor film is etched, whereby the semiconductor layer 603_a is formed as shown in FIG. 6C.

For example, a film of an oxide semiconductor material that can be used for the semiconductor layer 603_a is formed by sputtering, so that the oxide semiconductor film can be formed. Note that the oxide semiconductor film may be formed in a rare gas atmosphere, an oxygen atmosphere, or a mixed atmosphere of a rare gas and oxygen. In the case of forming an oxide semiconductor layer including CAAC as the semiconductor layer 603_a, an oxide semiconductor film is formed by sputtering with the temperature of an element formation layer where the oxide semiconductor film is formed set to be higher than or equal to 100° C. and lower than or equal to 500° C., preferably higher than or equal to 200° C. and lower than or equal to 350° C. At this time, the concentration of impurities such as hydrogen or water in the sputtering apparatus is preferably extremely low. For example, by performing heat treatment before formation of the oxide semiconductor film, the concentration of impurities such as hydrogen or water in the sputtering apparatus can be reduced. Further, in this case, the insulating layer 602_a is preferably flat. For example, the average surface roughness of the insulating layer 602_a is preferably less than 0.5 nm, further preferably less than or equal to 0.1 nm.

The oxide semiconductor film can be formed using an oxide target having a composition ratio of $In_2O_3:Ga_2O_3:ZnO=1:1:1$ (in a molar ratio) as a sputtering target. Alternatively, for example, the oxide semiconductor film may be formed using an oxide target having a composition ratio of $In_2O_3:Ga_2O_3:ZnO=1:1:2$ (in a molar ratio).

When sputtering is employed, for example, the semiconductor layer 603_a is formed under a rare gas (typically, argon) atmosphere, an oxygen atmosphere, or a mixed atmosphere of a rare gas and oxygen. In the case of forming the semiconductor layer 603_a in a mixed atmosphere of a rare gas and oxygen, the amount of oxygen is preferably larger than that of the rare gas.

Figure 6D:
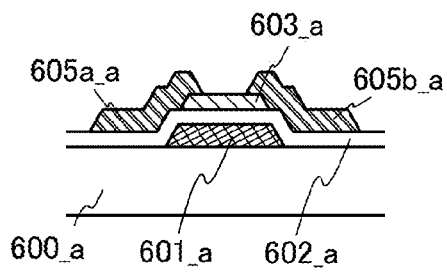

Next, as shown in FIG. 6D, a second conductive film is formed over the insulating layer 602_a and the semiconductor layer 603_a and is partly etched, so that the conductive layer 605a_a and the conductive layer 605b_a are formed.

For example, a film of a material that can be used for the conductive layer 605a_a and the conductive layer 605b_a is formed by sputtering or the like, whereby the second conductive film can be formed. The second conductive film can also be formed by stacking films of materials that can be used for the conductive layer 605a_a and the conductive layer 605b_a.

Figure 6E:
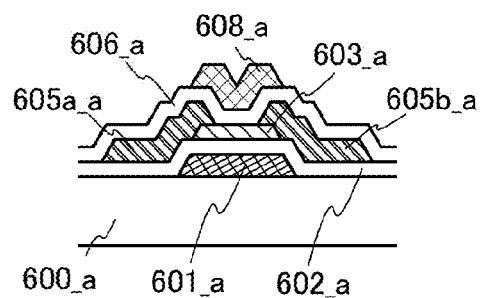

Next, as shown in FIG. 6E, the insulating layer 606_a is formed to be in contact with the semiconductor layer 603_a.

For example, a film that can be used as the insulating layer 606_a is formed in a rare gas (typically, argon) atmosphere, an oxygen atmosphere, or a mixed atmosphere of a rare gas and oxygen by sputtering, whereby the insulating layer 606_a can be formed. The insulating layer 606_a formed by sputtering can suppress a reduction in resistance of a portion of the semiconductor layer 603_a, which functions as a back channel of the transistor. The temperature of the substrate at the time when the insulating layer 606_a is formed is preferably higher than or equal to room temperature and lower than or equal to 300° C.

Before formation of the insulating layer 606_a, plasma treatment with the use of a gas of $N_2O$, $N_2$, Ar, or the like may be performed to remove water or the like adsorbed on an exposed surface of the semiconductor layer 603_a. In the case of performing the plasma treatment, the insulating layer 606_a is preferably formed after the plasma treatment without exposure to air.

Further, in the example of the method for manufacturing the transistor in FIG. 5A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after part of the oxide semiconductor film is etched, after the second conductive film is formed, after part of the second conductive film is etched, or after the insulating layer 606_a is formed.

A heat treatment apparatus for the heat treatment can be an electric furnace or an apparatus for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, after the heat treatment, a high-purity oxygen gas, a high-purity $N_2O$ gas, or ultra-dry air (having a dew point of −40° C. or lower, preferably −60° C. or lower) may be introduced in the furnace where the heat treatment has been performed while the heating temperature is being maintained or being decreased. It is preferable that the oxygen gas or the $N_2O$ gas do not contain water, hydrogen, and the like. The purity of the oxygen gas or the $N_2O$ gas which is introduced into the heat treatment apparatus is preferably greater than or equal to 6N, more preferably greater than or equal to 7N (i.e., the impurity concentration of the oxygen gas or the $N_2O$ gas is preferably less than or equal to 1 ppm, more preferably less than or equal to 0.1 ppm). By the action of the oxygen gas or the $N_2O$ gas, oxygen is supplied to the semiconductor layer 603_a, so that defects caused by oxygen deficiency in the semiconductor layer 603_a can be reduced. Note that the introduction of a high-purity oxygen gas, a high-purity $N_2O$ gas, or ultra-dry air may be performed at the time of the above heat treatment.

Oxygen doping using oxygen plasma may be performed after the insulating layer 602_a is formed, after the oxide semiconductor film is formed, after the conductive layers serving as the source electrode and the drain electrode are formed, after the insulating layer over the conductive layers serving as the source electrode and the drain electrode is formed, or after the heat treatment is performed. For example, oxygen doping treatment using a high-density plasma of 2.45 GHz may be performed. Alternatively, oxygen doping treatment may be performed by ion implantation. The oxygen doping can reduce variations in electric characteristics of transistors to be manufactured. For example, the oxygen doping is performed to make one of or both the insulating layer 602_a and the insulating layer 606_a contain oxygen with a higher proportion than that in the stoichiometric composition.

When the insulating layer in contact with the semiconductor layer 603_a excessively contains oxygen, the oxygen can be more easily supplied to the semiconductor layer 603_a. As a result, oxygen defects in the semiconductor layer 603_a or at an interface between the semiconductor layer 603_a and one of or both the insulating layer 602_a and the insulating layer 606_a can be reduced, which results in further reduction in the carrier concentration in the semiconductor layer 603_a. Even when the semiconductor layer 603_a is made to excessively contain oxygen through manufacturing steps, the insulating layer in contact with the semiconductor layer 603_a can prevent the semiconductor layer 603_a from releasing oxygen.

For example, when an insulating layer containing gallium oxide is formed as one or each of the insulating layer 602_a and the insulating layer 606_a, the composition of the gallium oxide can be set to be $Ga_2O_x$ by supplying the insulating layer with oxygen.

Alternatively, when an insulating layer containing aluminum oxide is formed as one or each of the insulating layer 602_a and the insulating layer 606_a, the composition of the aluminum oxide can be set to be $Al_2O_x$ by supplying the insulating layer with oxygen.

Further, when an insulating layer containing gallium aluminum oxide or aluminum gallium oxide is formed as one or each of the insulating layer 602_a and the insulating layer 606_a, the composition of the gallium aluminum oxide or the aluminum gallium oxide can be set to be $Ga_xAl_{2-x}O_{3+\alpha}$, by supplying the insulating layer with oxygen.

Through the above steps, an impurity such as hydrogen, water, a hydroxyl group, or hydride (also referred to as a hydrogen compound) is removed from the semiconductor layer 603_a and oxygen is supplied to the semiconductor layer 603_a; thus, the oxide semiconductor layer can be purified.

Further, in addition to the heat treatment, after the insulating layer 606_a is formed, heat treatment (preferably at higher than or equal to 200° C. and lower than or equal to 600° C., for example, higher than or equal to 250° C. and lower than or equal to 350° C.) may be performed in an inert gas atmosphere or an oxygen gas atmosphere.

Moreover, as shown in FIG. 6E, a third conductive film is formed over the insulating layer 606_a and part of the third conductive film is etched, whereby the conductive layer 608_a is formed.

For example, a film of a material that can be used for the conductive layer 608_a is formed by sputtering, whereby the third conductive film can be formed. The third conductive film can also be formed by stacking layers of materials that can be used for the third conductive film.

The example of the method for manufacturing the transistor, which is shown in this embodiment, does not necessarily apply only to the transistor in FIG. 5A. For example, if any of the components illustrated in FIGS. 5B to 5D has the same designation as the components in FIG. 5A and has a function, at least part of which is the same as that of the components in FIG. 5A, the description of the example of the method for manufacturing the transistor in FIG. 5A can be employed as appropriate.

In the case where the regions 604a_c and 604a_d or the regions 604b_c and 604b_d are formed as shown in FIG. 5C or FIG. 5D, the regions 604a_c and 604a_d or the regions 604b_c and 604b_d are formed in a self-aligned manner by adding a dopant to a semiconductor layer from a side where a conductive layer serving as a gate is formed through an insulating layer serving as a gate insulating layer.

For example, the dopant can be added with the use of an ion doping apparatus or an ion implantation apparatus.

As described with reference to FIGS. 5A to 5D and FIGS. 6A to 6E, the example of the transistor in this embodiment includes a conductive layer functioning as a gate electrode; an insulating layer functioning as a gate insulating layer; an oxide semiconductor layer which includes a channel and overlaps with conductive layer functioning as a gate with the insulating layer functioning as a gate insulating layer provided therebetween; a conductive layer which is electrically connected to the oxide semiconductor layer and functions as one of a source and a drain; and a conductive layer which is electrically connected to the oxide semiconductor layer and functions as the other of the source and the drain.

The oxide semiconductor layer in which a channel is formed is an oxide semiconductor layer which is made intrinsic (i-type) or substantially intrinsic (i-type) by being purified. Purification of the oxide semiconductor layer can make the carrier concentration of the oxide semiconductor layer lower than $1\times10^{14}/cm^3$, preferably lower than $1\times10^{12}/cm^3$, further preferably lower than $1\times10^{11}/cm^3$. With the above structure, the off-state current per micrometer of the channel width can be 10 aA ($1\times10^{-17}$ A) or less, 1 aA ($1\times10^{-18}$ A) or less, 10 zA ($1\times10^{-20}$ A) or less, further 1 zA ($1\times10^{-21}$ A) or less, and furthermore 100 yA ($1\times10^{-22}$ A) or less. It is preferable that the off-state current of the transistor be as low as possible. The lowest value of the off-state current of the transistor in this embodiment is estimated to be about $10^{-30}$ A/μm.

With the use of the transistor including the oxide semiconductor layer in this embodiment as the control transistor in any of the memory devices in the above embodiments, a data holding period of the memory cell can be lengthened.

Embodiment 4

In this embodiment, a structural example of any of the memory devices in the above embodiments will be described.

The memory device in this embodiment is formed using a transistor including a semiconductor layer in which a channel is formed and which contains a semiconductor belonging to Group 14 of the periodic table (e.g., silicon) and a transistor including an oxide semiconductor layer in which a channel is formed. In this case, the transistor including an oxide semiconductor layer in which a channel is formed can be stacked over the transistor including a semiconductor layer which contains a semiconductor belonging to Group 14 of the periodic table (e.g., silicon). The transistor including a semiconductor layer which contains a semiconductor belonging to Group 14 of the periodic table (e.g., silicon) can be applied to the transistors in the comparison circuit 101 and the comparison circuit 102 in FIG. 1, for example.

FIG. 7 illustrates an example in which the transistor including an oxide semiconductor layer in which a channel is formed is stacked over the transistor including a semiconductor layer which contains a semiconductor belonging to Group 14 of the periodic table (e.g., silicon). Note that the components illustrated in FIG. 7 include those having sizes different from the actual sizes.

In FIG. 7, a p-channel transistor (e.g., the transistor 112 in FIG. 2A) and an n-channel transistor (e.g., the transistor 111 in FIG. 2A) each including a semiconductor layer which contains a semiconductor belonging to Group 14 of the periodic table (e.g., silicon) and a transistor (e.g., the transistor 131 in FIG. 2A) including an oxide semiconductor layer in which a channel is formed are formed using a semiconductor layer 780, an insulating layer 784a, an insulating layer 784b, a conductive layer 785a, a conductive layer 785b, an insulating layer 786a, an insulating layer 786b, an insulating layer 786c, an insulating layer 786d, an insulating layer 788, a semiconductor layer 753, a conductive layer 754a, a conductive layer 754b, an insulating layer 755, a conductive layer 756, an insulating layer 757a, an insulating layer 757b, an insulating layer 758, an insulating layer 759, a conductive layer 760a, and a conductive layer 760b.

Further, the semiconductor layer 780 includes a region 782a, a region 782b, a region 782c, and a region 782d. The semiconductor layer 780 is provided with insulating regions 781a to 781c, whereby the transistors are electrically separated from each other.

As the semiconductor layer 780, for example, a semiconductor substrate can be used. Alternatively, a semiconductor layer provided over a different substrate can be used as the semiconductor layer 780.

Note that in a region of the semiconductor layer 780 which is between a plurality of memory cells, an insulating separation region may be provided.

The region 782a and the region 782b are regions which are separated from each other and to which a dopant imparting p-type conductivity is added. The region 782a and the region 782b function as a source region and a drain region of the p-channel transistor. For example, the region 782a and the region 782b may each be electrically connected to an additionally provided conductive layer.

The region 782c and the region 782d are regions which are separated from each other and to which a dopant imparting n-type conductivity is added. The region 782c and the region 782d function as a source region and a drain region of the n-channel transistor. For example, the region 782c and the region 782d may each be electrically connected to an additionally provided conductive layer (e.g., a conductive layer functioning as a data line).

Note that a low-concentration region may be partly provided in each of the regions 782a to 782d. In that case, the depth of the low-concentration regions may be smaller than the depth of the rest of the regions 782a to 782d, but this embodiment is not limited thereto.

The insulating layer 784a is provided over a region of the semiconductor layer 780 which is between the insulating region 781a and the insulating region 781b. The insulating layer 784a functions as a gate insulating layer of the p-channel transistor.

The insulating layer 784b is provided over a region of the semiconductor layer 780 which is between the insulating region 781b and the insulating region 781c. The insulating layer 784b functions as a gate insulating layer of the n-channel transistor.

Each of the insulating layers 784a and 784b can be, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic). The insulating layers 784a and 784b may be formed by stacking layers of materials that can be used for the insulating layers 784a and 784b.

The conductive layer 785a overlaps with the semiconductor layer 780 with the insulating layer 784a provided therebetween. A region of the semiconductor layer 780 which overlaps with the conductive layer 785a is a channel formation region of the p-channel transistor. The conductive layer 785a functions as a gate of the p-channel transistor.

The conductive layer 785b overlaps with the semiconductor layer 780 with the insulating layer 784b provided therebetween. A region of the semiconductor layer 780 which overlaps with the conductive layer 785b is a channel formation region of the n-channel transistor. The conductive layer 785b functions as a gate of the n-channel transistor.

Each of the conductive layers 785a and 785b can be, for example, a layer of a metal material such as molybdenum, magnesium, titanium, chromium, tantalum, tungsten, aluminum, copper, neodymium, or scandium or an alloy material containing any of these materials as a main component. The conductive layers 785a and 785b can also be formed by stacking layers of materials that can be used for the conductive layers 785a and 785b.

The insulating layer 786a is provided over the insulating layer 784a and is in contact with one of a pair of side surfaces of the conductive layer 785a which face each other.

The insulating layer 786b is provided over the insulating layer 784a and is in contact with the other of the pair of side surfaces of the conductive layer 785a which face each other.

The insulating layer 786c is provided over the insulating layer 784b and is in contact with one of a pair of side surfaces of the conductive layer 785b which face each other.

The insulating layer 786d is provided over the insulating layer 784b and is in contact with the other of the pair of side surfaces of the conductive layer 785b which face each other.

The insulating layer 788 is provided over the insulating layer 786a, the insulating layer 786b, the insulating layer 786c, and the insulating layer 786d.

Each of the insulating layers 786a to 786d and the insulating layer 788 can be a layer of any of the materials that can be used for the insulating layers 784a and 784b, which may be the same as or different from the material used for the insulating layers 784a and 784b. Further, the insulating layers 786a to 786d and the insulating layer 788 can each be formed by stacking layers of materials that can be used for the insulating layers 786a to 786d and the insulating layer 788.

The semiconductor layer 753 is provided over the insulating layer 788. The semiconductor layer 753 includes a region 752a and a region 752b. The region 752a and the region 752b are regions to which a dopant is added, and function as a source region and a drain region. As the dopant, any of the dopants that can be used for the transistor including an oxide semiconductor layer in the above embodiment can be used as appropriate.

The semiconductor layer 753 can be a layer of a material that can be used for the semiconductor layer 603_a illustrated in FIG. 5A, for example.

The insulating layer 755 is provided over the semiconductor layer 753.

The insulating layer 755 functions as a gate insulating layer of the transistor.

The insulating layer 755 can be a layer of a material that can be used for the insulating layer 602_a illustrated in FIG. 5A, for example. The insulating layer 755 may be formed by stacking layers of materials that can be used for the insulating layer 755.

The conductive layer 756 overlaps with the semiconductor layer 753 with the insulating layer 755 provided therebetween. The conductive layer 756 functions as a gate of the transistor.

The conductive layer 756 can be a layer of a material that can be used for the conductive layer 601_a illustrated in FIG. 5A, for example. The conductive layer 756 may be formed by stacking layers of materials that can be used for the conductive layer 756.

The insulating layer 757a and the insulating layer 757b are provided over the insulating layer 755 and in contact with side surfaces of the conductive layer 756.

The conductive layer 754a is in contact with and electrically connected to the semiconductor layer 753. The conductive layer 754a is electrically connected to the conductive layer 785a. The conductive layer 754a functions as a source or a drain of the transistor including an oxide semiconductor layer.

The conductive layer 754b is in contact with and electrically connected to the semiconductor layer 753. The conductive layer 754b is electrically connected to the conductive layer 785b. The conductive layer 754b functions as the source or the drain of the transistor including an oxide semiconductor layer.

Each of the conductive layers 754a and 754b can be, for example, a layer of a material that can be used for the conductive layers 605a_a and 605b_a illustrated in FIG. 5A. The conductive layers 754a and 754b may be formed by stacking layers of materials that can be used for the conductive layers 754a and 754b.

The insulating layer 758 is provided over the conductive layer 756, the insulating layer 757a, the insulating layer 757b, the conductive layer 754a, and the conductive layer 754b.

The insulating layer 758 can be a layer of a material that can be used for the insulating layer 602_a illustrated in FIG. 5A, for example. The insulating layer 758 may be formed by stacking layers of materials that can be used for the insulating layer 758. The insulating layer 758 functions as a protective layer suppressing entry of an impurity.

The insulating layer 759 is provided over the insulating layer 758.

The insulating layer 759 can be a layer of a material that can be used for the insulating layer 602_a illustrated in FIG. 5A, for example. The insulating layer 759 may be formed by stacking layers of materials that can be used for the insulating layer 759.

The conductive layer 760a is electrically connected to the conductive layer 754a through an opening formed in the insulating layer 758 and the insulating layer 759. The conductive layer 760a functions as the source or the drain of the transistor including an oxide semiconductor layer.

The conductive layer 760b is electrically connected to the conductive layer 754b through an opening formed in the insulating layer 758 and the insulating layer 759. The conductive layer 760b functions as the source or the drain of the transistor including an oxide semiconductor layer.

Each of the conductive layers 760a and 760b can be, for example, a layer of a material that can be used for the conductive layers 605a_a and 605b_a illustrated in FIG. 5A. The conductive layers 760a and 760b may be formed by stacking layers of materials that can be used for the conductive layers 760a and 760b.

The above is the description of the structural example of the memory device illustrated in FIG. 7.

As described with reference to FIG. 7, in the structural example of the memory device in this embodiment, the memory device is formed by stacking transistors which include semiconductor layers formed using different materials, whereby the circuit area can be reduced.

Embodiment 5

In this embodiment, an example of an arithmetic processing unit such as a CPU will be described.

The example of the arithmetic processing unit in this embodiment is described with reference to FIG. 8.

Figure 8:
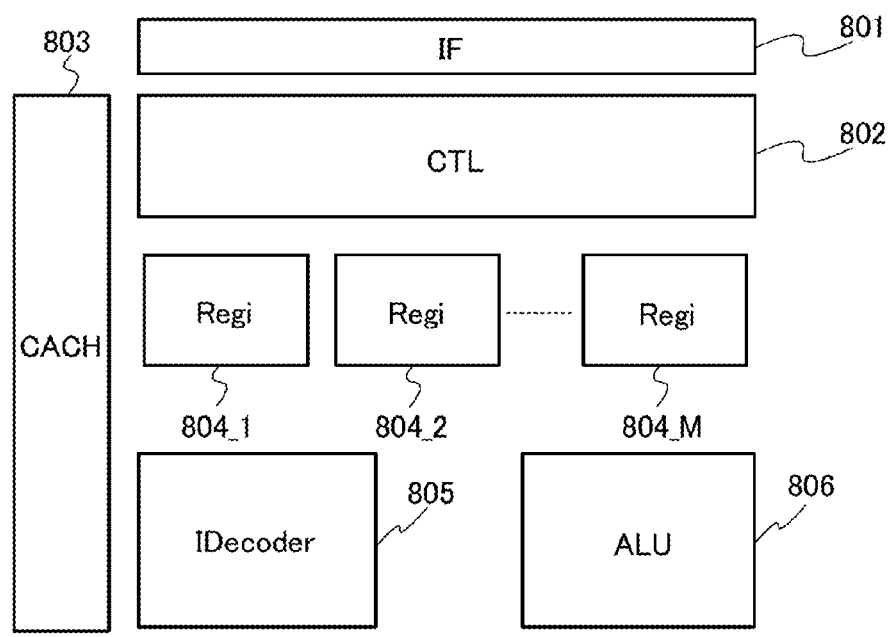
FIG. 8 illustrates an example of an arithmetic processing unit.

The arithmetic processing unit illustrated in FIG. 8 includes a bus interface (also referred to as an IF) 801, a control unit (also referred to as a CTL) 802, a cache memory (also referred to as a CACH) 803, M (M is a natural number greater than or equal to 3) registers (also referred to as Regis) 804 (registers 804_1 to 804_M), an instruction decoder (also referred to as an IDecoder) 805, and an arithmetic logic unit (also referred to as an ALU) 806.

The bus interface 801 has a function of exchanging signals with the external of the arithmetic processing unit and a function of exchanging signals with circuits in the arithmetic processing unit, and the like.

The control unit 802 has a function of controlling operations of the circuits in the arithmetic processing unit.

The cache memory 803 is controlled by the control unit 802 and has a function of temporarily holding data during the operation of the arithmetic processing unit. Note that the arithmetic processing unit may include a plurality of cache memories 803 as a primary cache and a secondary cache, for example. For example, the memory device in the above embodiment can be used for the cache memory 803 as a content addressable memory.

The M registers 804 are controlled by the control unit 802 and each have a function of storing data used for arithmetic processing. For example, one register 804 may be used as a register for the arithmetic logic unit 806 and another register 804 may be used as a register for the instruction decoder 805.

The instruction decoder 805 has a function of translating an instruction signal which is read. The translated instruction signal is input to the control unit 802, and the control unit 802 outputs a control signal in accordance with the instruction signal to the arithmetic logic unit 806.

The arithmetic logic unit 806 is controlled by the control unit 802 and has a function of performing arithmetic processing in accordance with the input instruction signal.

As described with reference to FIG. 8, in the arithmetic processing unit in this embodiment, the area of the arithmetic processing unit can be reduced by reducing the area of the cache memory.

The memory device described in the above embodiment is used for the cache memory in the example of the arithmetic processing unit in this embodiment; thus, the cache memory can be equipped with a function of selecting whether to output data stored in the cache memory in accordance with search data.

In the arithmetic processing unit in this embodiment, even when the supply of the power supply voltage is stopped, part of internal data in the state at the time just before the supply of the power supply voltage is stopped can be retained in the cache memory, and when the supply of the power supply voltage restarts, the state of the arithmetic processing unit can be returned to the state at the time just before the supply of the power supply voltage is stopped. Accordingly, even when power consumption is reduced by selectively stopping the supply of the power supply voltage, a time after the supply of the power supply voltage restarts until the normal operation starts can be shortened.

Embodiment 6

In this embodiment, an oxide (an oxide including CAAC) including a phase with c-axis alignment, which has a triangular or hexagonal atomic arrangement when seen from the direction of an a-b plane, a surface, or an interface, will be described. In the phase, metal atoms are arranged in a layered manner, or metal atoms and oxygen atoms are arranged in a layered manner along the c-axis, and the direction of the a-axis or the b-axis is varied in the a-b plane (the phase rotates around the c-axis).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 10A to 10E, FIGS. 11A to 11C, and FIGS. 12A to 12C. In FIGS. 10A to 10E, FIGS. 11A to 11C, and FIGS. 12A to 12C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 10A to 10E, O surrounded by a circle represents tetracoordinate O and O surrounded by a double circle represents tricoordinate O.

Figure 10A:
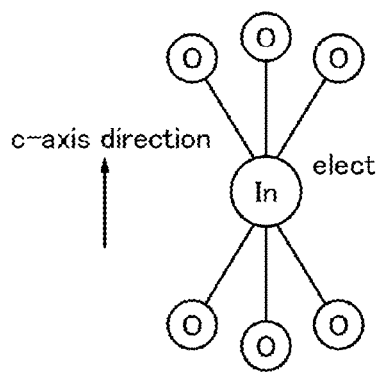
FIGS. 10A to 10E each illustrate a crystal structure of an oxide material.

FIG. 10A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 10A is actually an octahedral structure, but is illustrated as a planar structure for simplicity. Note that three tetracoordinate O atoms exist in each of an upper half and a lower half in FIG. 10A. In the small group illustrated in FIG. 10A, electric charge is 0.

Figure 10D:
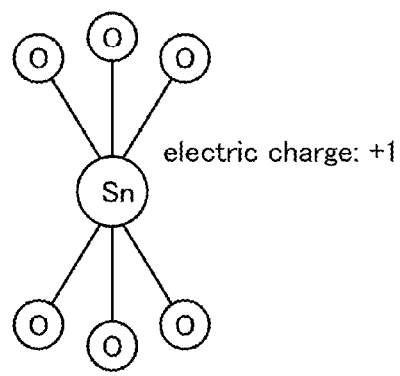
Figure 10B:
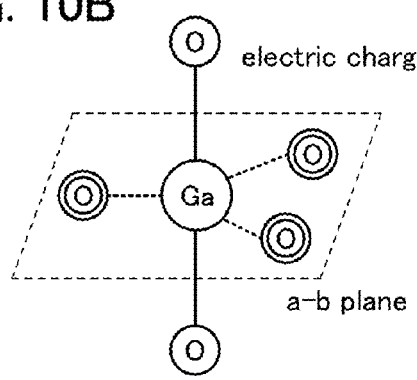

FIG. 10B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 10B. An In atom can also have the structure illustrated in FIG. 10B because an In atom can have five ligands. In the small group illustrated in FIG. 10B, electric charge is 0.

Figure 10E:
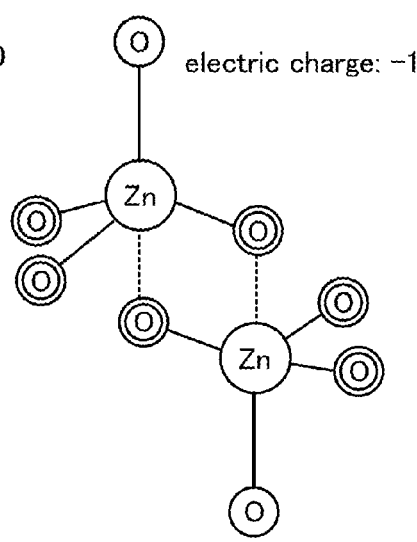
Figure 10C:
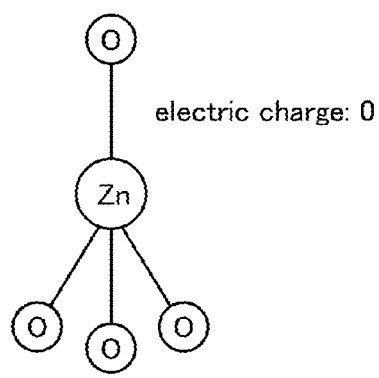

FIG. 10C illustrates a structure including one tetracoordinate Zn atom and four tetracoordinate O atoms proximate to the Zn atom. In FIG. 10C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 10C. In the small group illustrated in FIG. 10C, electric charge is 0.

FIG. 10D illustrates a structure including one hexacoordinate Sn atom and six tetracoordinate O atoms proximate to the Sn atom. In FIG. 10D, three tetracoordinate O atoms exist in each of an upper half and a lower half. In the small group illustrated in FIG. 10D, electric charge is +1.

FIG. 10E illustrates a small group including two Zn atoms. In FIG. 10E, one tetracoordinate O atom exists in each of an upper half and a lower half. In the small group illustrated in FIG. 10E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 10A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 11A:
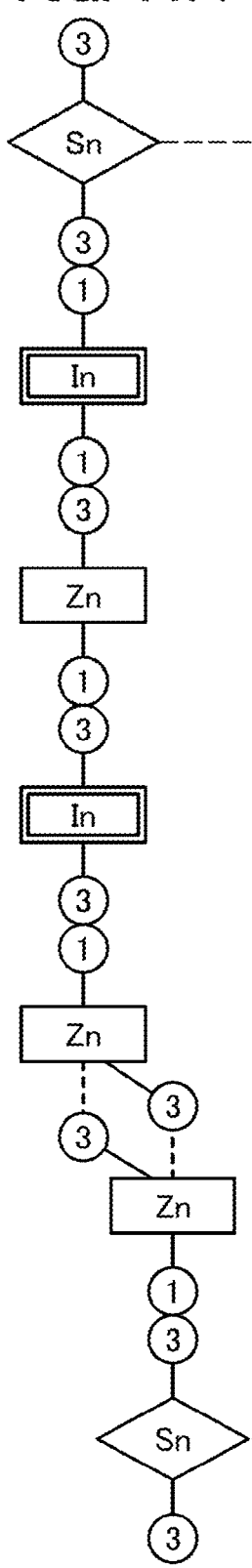
FIGS. 11A to 11C illustrate a crystal structure of an oxide material.
Figure 11B:
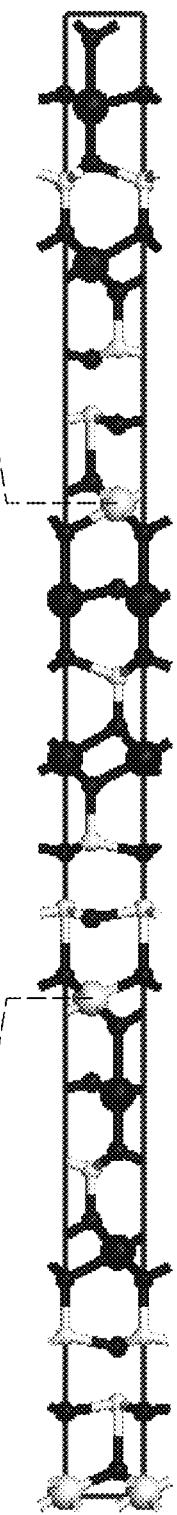
Figure 11C:
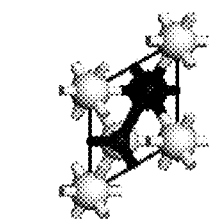

FIG. 11A illustrates a model of a medium group included in a layered structure of an In—Sn—Zn—O-based material. FIG. 11B illustrates a large group including three medium groups. Note that FIG. 11C illustrates an atomic arrangement in the case where the layered structure in FIG. 11B is observed from the c-axis direction.

In FIG. 11A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 11A, one tetracoordinate O atom existing in each of an upper half and a lower half with respect to an In atom is denoted by circled 1. FIG. 11A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 11A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 10E can be given. For example, with one small group including two Zn atoms, electric charge of one small group including a Sn atom can be cancelled, so that the total electric charge of the layered structure can be 0.

When the large group illustrated in FIG. 11B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the followings: a four-component metal oxide such as an In—Sn—Ga—Zn—O-based metal oxide; a three-component metal oxide such as an In—Ga—Zn—O-based metal oxide (also referred to as IGZO), an In—Al—Zn—O-based metal oxide, a Sn—Ga—Zn—O-based metal oxide, an Al—Ga—Zn—O-based metal oxide, a Sn—Al—Zn—O-based metal oxide, an In—Hf—

Zn—O-based metal oxide, an In—La—Zn—O-based metal oxide, an In—Ce—Zn—O-based metal oxide, an In—Pr—Zn—O-based metal oxide, an In—Nd—Zn—O-based metal oxide, an In—Sm—Zn—O-based metal oxide, an In—Eu—Zn—O-based metal oxide, an In—Gd—Zn—O-based metal oxide, an In—Tb—Zn—O-based metal oxide, an In—Dy—Zn—O-based metal oxide, an In—Ho—Zn—O-based metal oxide, an In—Er—Zn—O-based metal oxide, an In—Tm—Zn—O-based metal oxide, an In—Yb—Zn—O-based metal oxide, or an In—Lu—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Ga—O-based metal oxide; a single-component metal oxide such as an In—O-based metal oxide, a Sn—O-based metal oxide, or a Zn—O-based metal oxide; and the like.

As an example, FIG. 12A illustrates a model of a medium group included in a layered structure of an In—Ga—Zn—O-based material.

In the medium group included in the layered structure of the In—Ga—Zn—O-based material in FIG. 12A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 12B illustrates a large group including three medium groups. Note that FIG. 12C illustrates an atomic arrangement in the case where the layered structure in FIG. 12B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 12A but also a medium group in which the arrangement of the In atom, the Ga atom, and the Zn atom is different from that in FIG. 12A.

Embodiment 7

In this embodiment, the field-effect mobility of a transistor will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[FORMULA 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \qquad \text{[FORMULA 5]}$$
$$\ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g}$$

The right side of Formula 5 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 13:
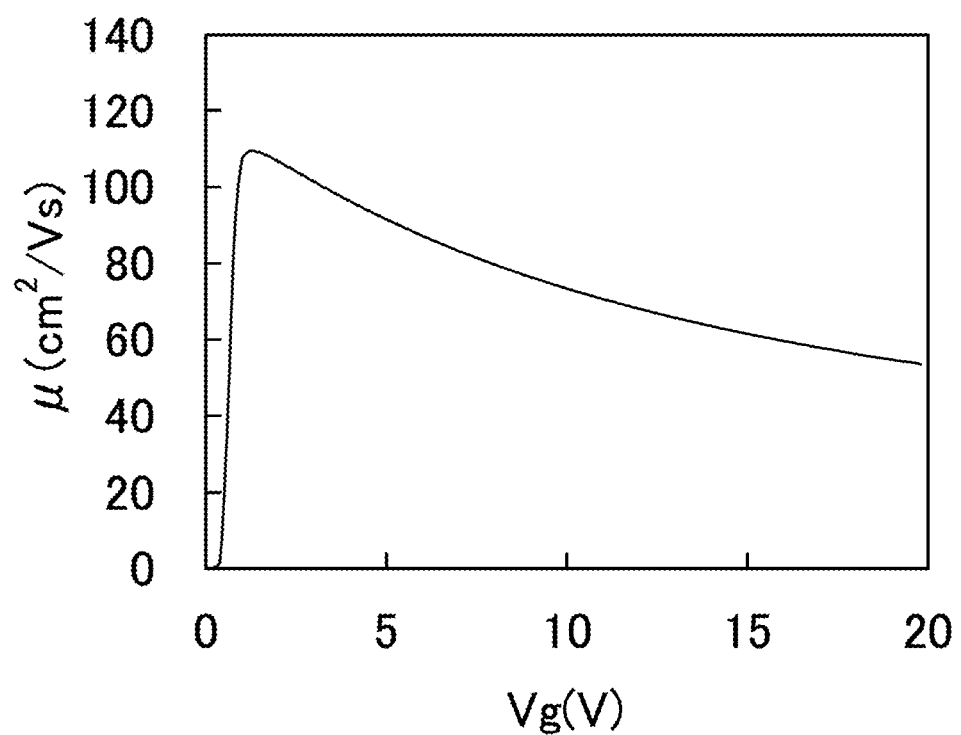
FIG. 13 shows gate voltage dependence of mobility obtained by calculation.

Calculation results of the mobility $\mu_2$ of a transistor whose channel includes an ideal oxide semiconductor without a defect inside the semiconductor are shown in FIG. 13. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 13, the mobility has a peak of 100 cm²/Vs or more at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 14A to 14C, FIGS. 15A to 15C, and FIGS. 16A to 16C. FIGS. 17A and 17B illustrate cross-sectional structures of the transistors used for the calculation. The transistors illustrated in FIGS. 17A and 17B each include a semiconductor region 2103a and a semiconductor region 2103c which have n⁺-type conductivity in an oxide semiconductor layer. The resistivities of the semiconductor region 2103a and the semiconductor region 2103c are $2 \times 10^{-3}$ Ωcm.

The transistor illustrated in FIG. 17A is formed over a base insulating layer 2101 and an embedded insulator 2102 which is embedded in the base insulating layer 2101 and formed of aluminum oxide. The transistor includes the semiconductor region 2103a, the semiconductor region 2103c, an intrinsic semiconductor region 2103b serving as a channel formation region therebetween, and a gate 2105. The width of the gate 2105 is 33 nm.

A gate insulating layer 2104 is formed between the gate 2105 and the semiconductor region 2103b. In addition, a sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulator has a width of 5 nm. A source 2108a and a drain 2108b are provided in contact with the semiconductor region 2103a and the semiconductor region 2103c, respectively. Note that the channel width of this transistor is 40 nm.

The transistor in FIG. 17B is the same as the transistor in FIG. 17A in that it is formed over the base insulating layer 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulating layer 2104, the sidewall insulator 2106a, the sidewall insulator 2106b, the insulator 2107, the source 2108a, and the drain 2108b.

The transistor illustrated in FIG. 17B is different from the transistor illustrated in FIG. 17A in the conductivity type of semiconductor regions under the sidewall insulator 2106a and the sidewall insulator 2106b. In the transistor illustrated in FIG. 17A, the semiconductor regions under the sidewall insulator 2106a and the sidewall insulator 2106b are part of the semiconductor region 2103a having n⁺-type conductivity and part of the semiconductor region 2103c having n'-type conductivity, whereas in the transistor illustrated in FIG. 17B, the semiconductor regions under the sidewall insulator 2106a and the sidewall insulator 2106b are part of the intrinsic semiconductor region 2103b. In other words, a region having a width of $L_{off}$ which overlaps with neither the semiconductor region 2103a (the semiconductor region 2103c) nor the gate 2105 is provided. This region is called an offset region, and the width $L_{off}$ is called an offset length. As is seen from the drawing, the offset length is equal to the width of the sidewall insulator 2106a (the sidewall insulator 2106b).

The other parameters used in calculation are as described above. For the calculation, device simulation software Sentaurus Device manufactured by Synopsys, Inc. was used.

Figure 14A:
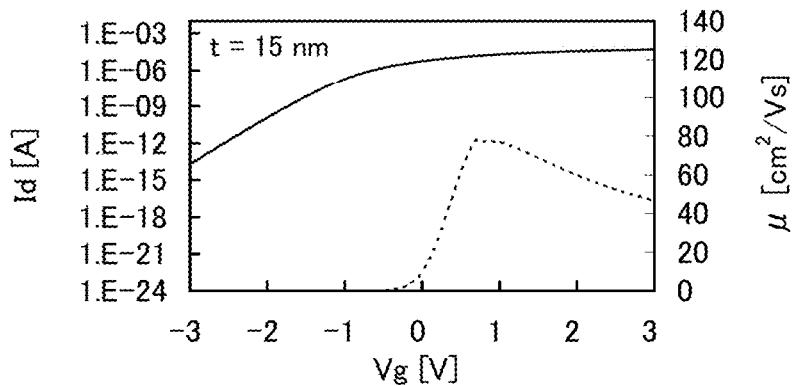
FIGS. 14A to 14C each show gate voltage dependence of drain current and mobility obtained by calculation.
Figure 14B:
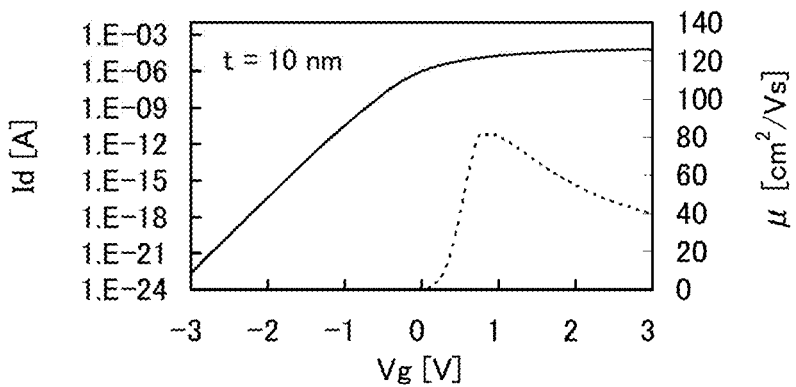
Figure 14C:
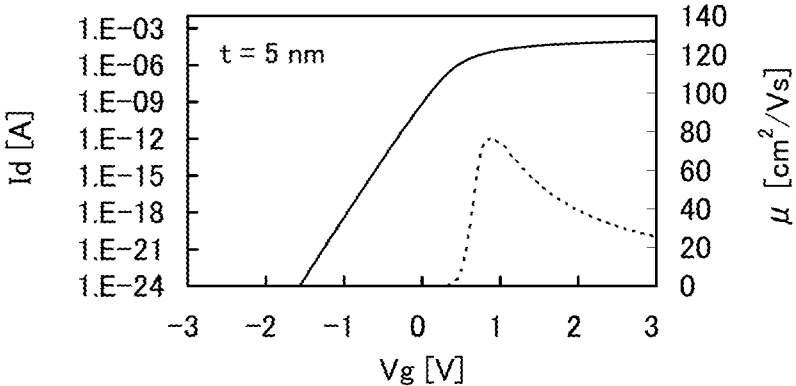

FIGS. 14A to 14C show the gate voltage ($V_g$: a potential difference between the gate and the source) dependence of the drain current ($I_d$, a solid line) and the mobility (μ, a dotted line) of the transistor having the structure illustrated in FIG. 17A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 14A shows the gate voltage dependence of the transistor in the case where the thickness of the gate insulating layer is 15 nm, FIG. 14B shows that of the transistor in the case where the thickness of the gate insulating layer is 10 nm, and FIG. 14C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA at a gate voltage of around 1 V.

Figure 15A:
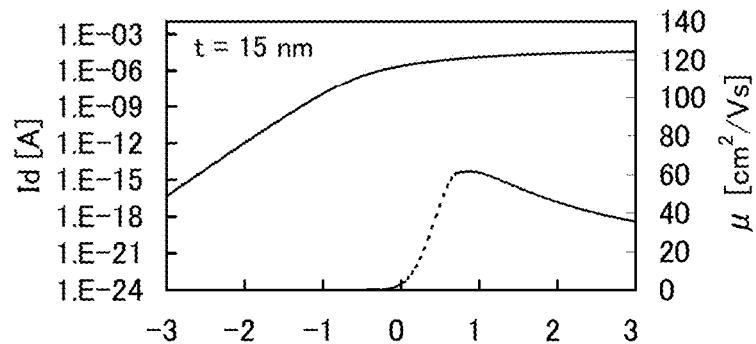
FIGS. 15A to 15C each show gate voltage dependence of drain current and mobility obtained by calculation.
Figure 15B:
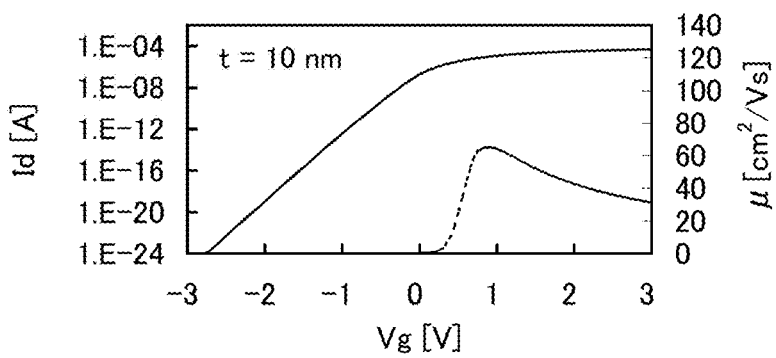
Figure 15C:
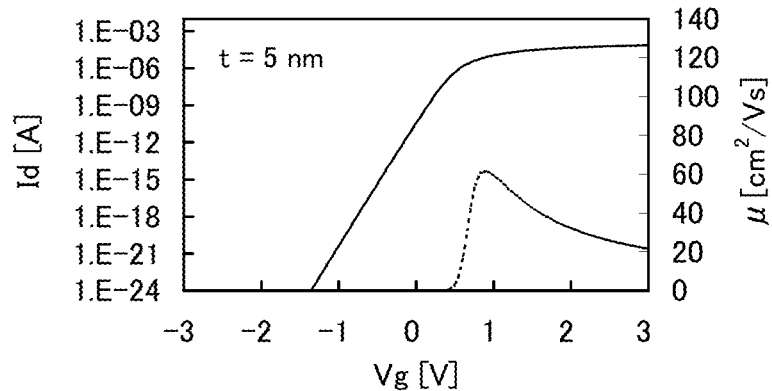

FIGS. 15A to 15C show the gate voltage $V_g$ dependence of the drain current $I_d$ (a solid line) and the mobility μ (a dotted line) of the transistor having the structure illustrated in FIG. 17B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 15A shows the gate voltage dependence of the transistor in the case where the thickness of the gate insulating layer is 15 nm, FIG. 15B shows that of the transistor in the case where the thickness of the gate insulating layer is 10 nm, and FIG. 15C shows that of the transistor in the case where the thickness of the gate insulating layer is 5 nm.

Figure 16A:
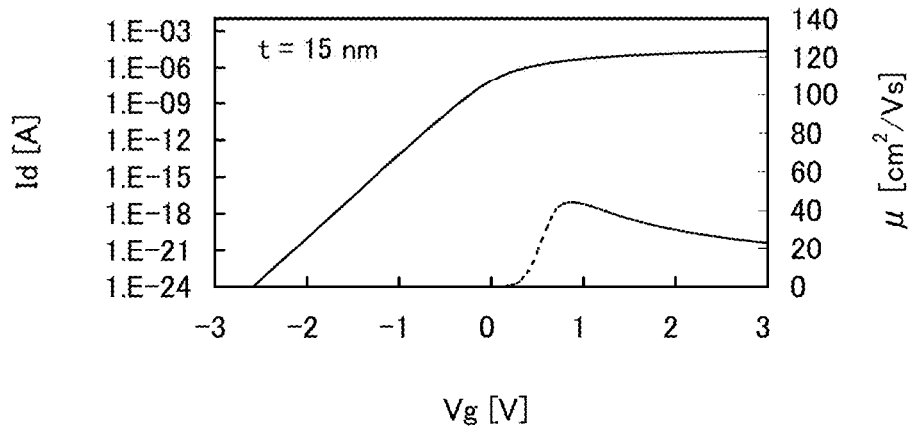
FIGS. 16A to 16C each show gate voltage dependence of drain current and mobility obtained by calculation.
Figure 16B:
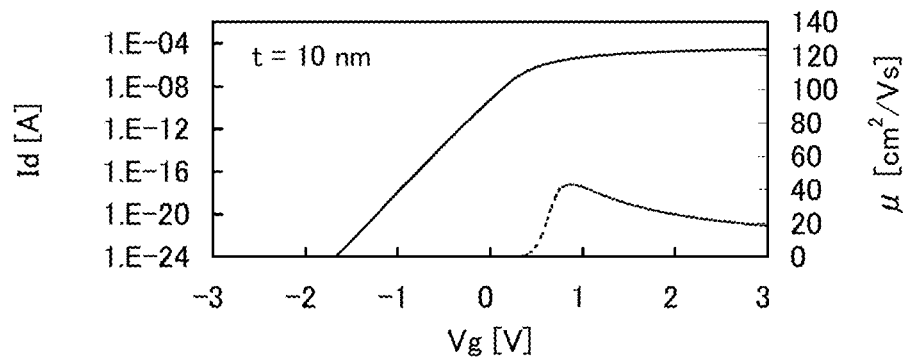
Figure 16C:
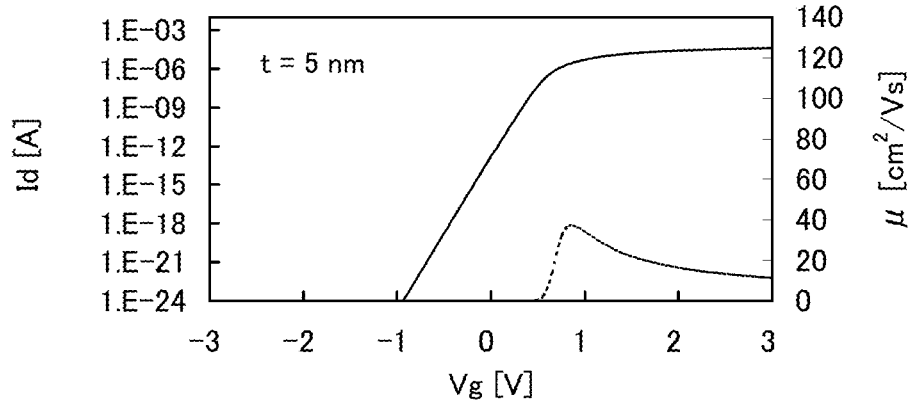

Further, FIGS. 16A to 16C show the gate voltage dependence of the drain current $I_d$ (a solid line) and the mobility μ (a dotted line) of the transistor having the structure illustrated in FIG. 17B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 16A shows the gate voltage dependence of the transistor in the case where the thickness of the gate insulating layer is 15 nm, FIG. 16B shows that of the transistor in the case where the thickness of the gate insulating layer is 10 nm, and FIG. 16C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm$^2$/Vs in FIGS. 14A to 14C, approximately 60 cm$^2$/Vs in FIGS. 15A to 15C, and approximately 40 cm$^2$/Vs in FIGS. 16A to 16C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V.

Embodiment 8

In this embodiment, a transistor in which an oxide semiconductor including In, Sn, and Zn as main components is used as an oxide semiconductor will be described.

A transistor in which an oxide semiconductor including In, Sn, and Zn as main components is used as a channel formation region can have favorable characteristics by depositing the oxide semiconductor while heating a substrate or by performing heat treatment after formation of an oxide semiconductor film. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 18A:
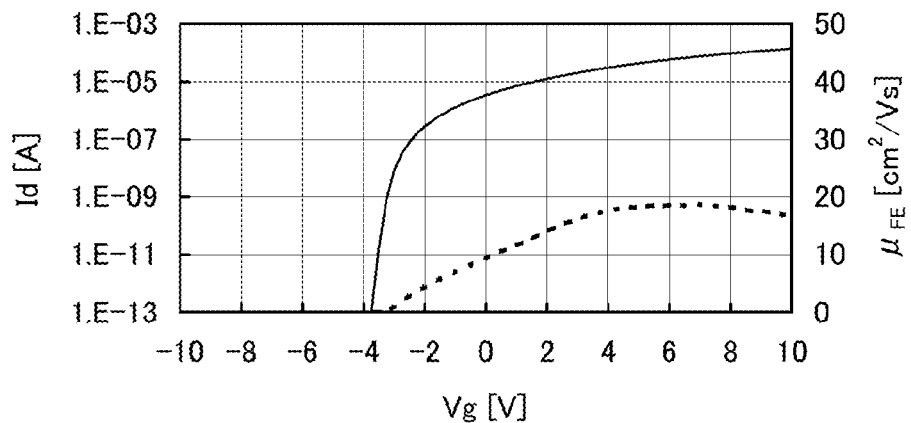
FIGS. 18A to 18C each show characteristics of a transistor.
Figure 18B:
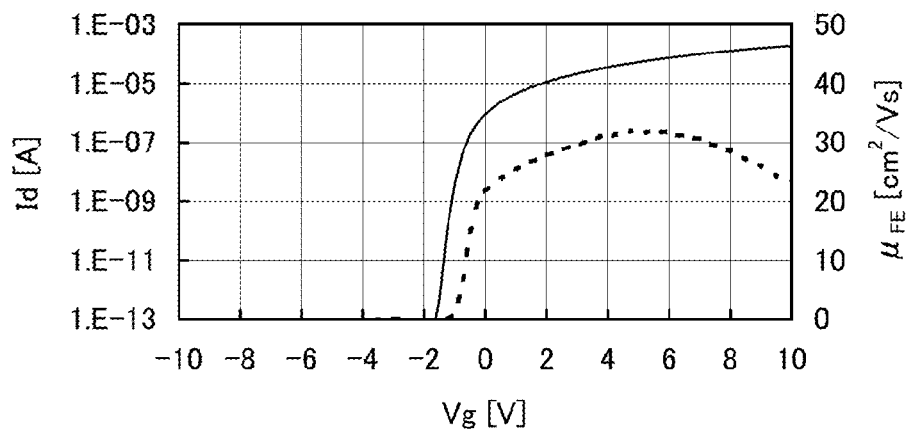
Figure 18C:
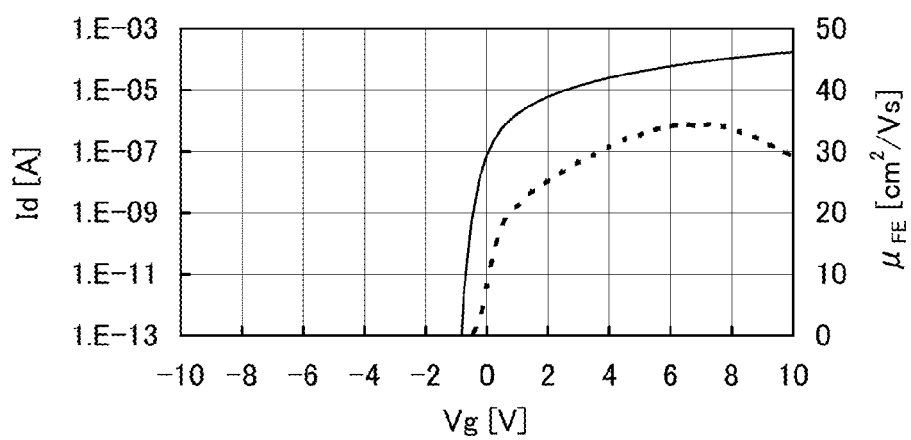

As an example, FIGS. 18A to 18C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 18A shows characteristics of a transistor whose oxide semiconductor film including In, Sn, and Zn as main components was formed by sputtering without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 18B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 18C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single-crystal oxide semiconductor, ideally, a field-effect mobility exceeding 100 cm$^2$/Vsec is expected to be realized.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 18A and 18B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to gate insulating layers was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 19A:
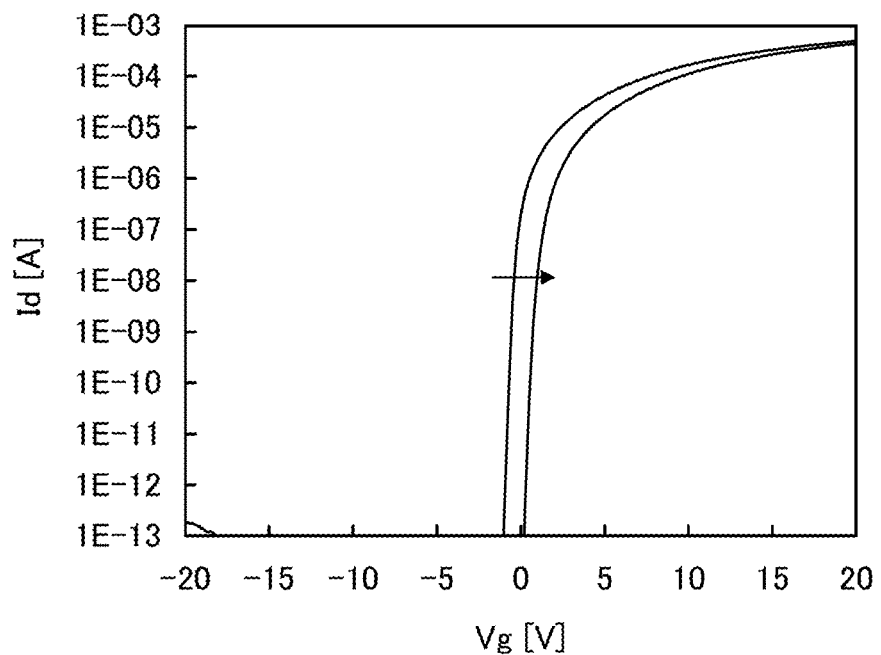
FIGS. 19A and 19B each show characteristics of a transistor.
Figure 19B:
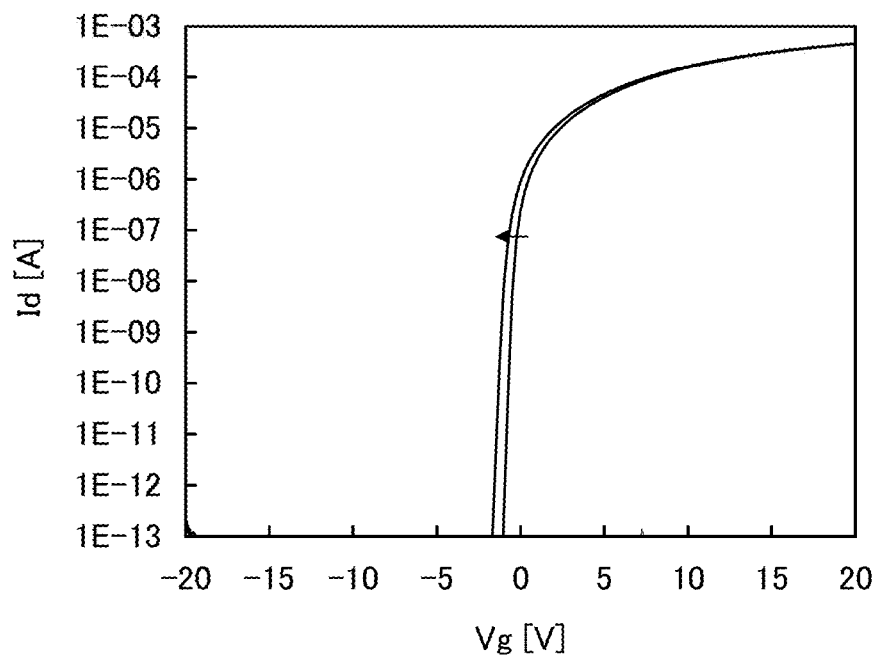
Figure 20A:
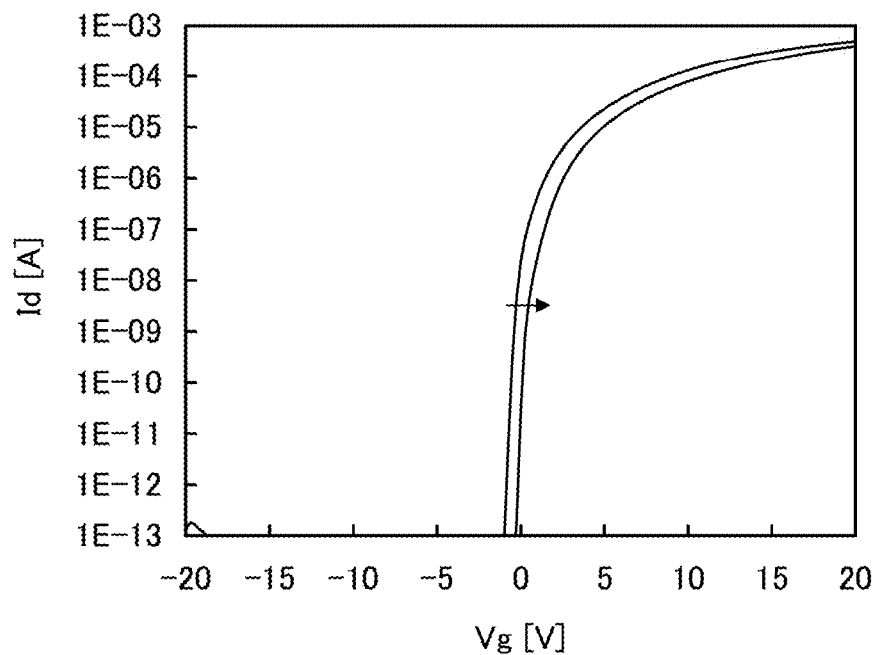
FIGS. 20A and 20B each show characteristics of a transistor.
Figure 20B:
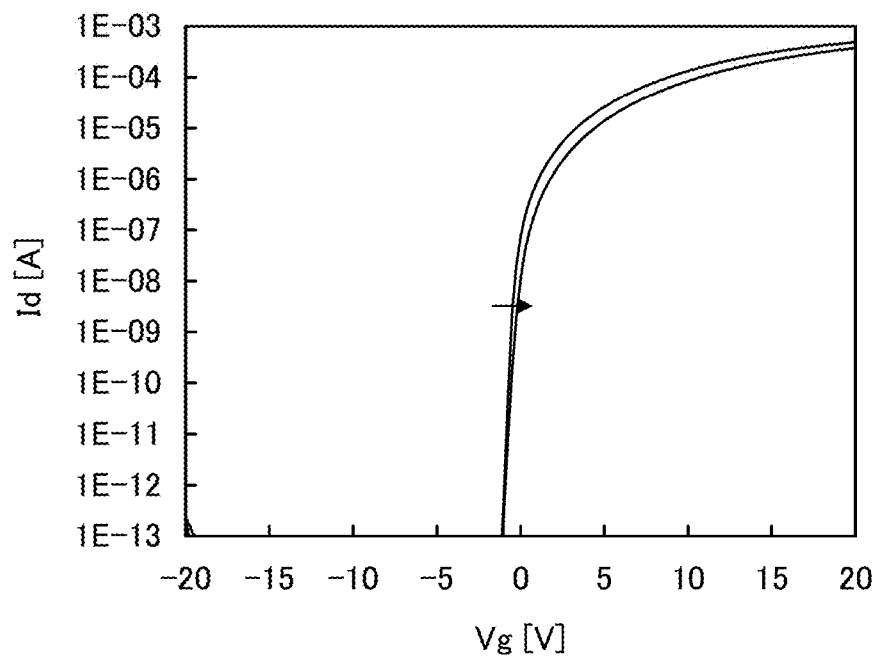

FIGS. 19A and 19B show a result of the positive BT test of Sample 1 and a result of the negative BT test of Sample 1, respectively. FIGS. 20A and 20B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 23:
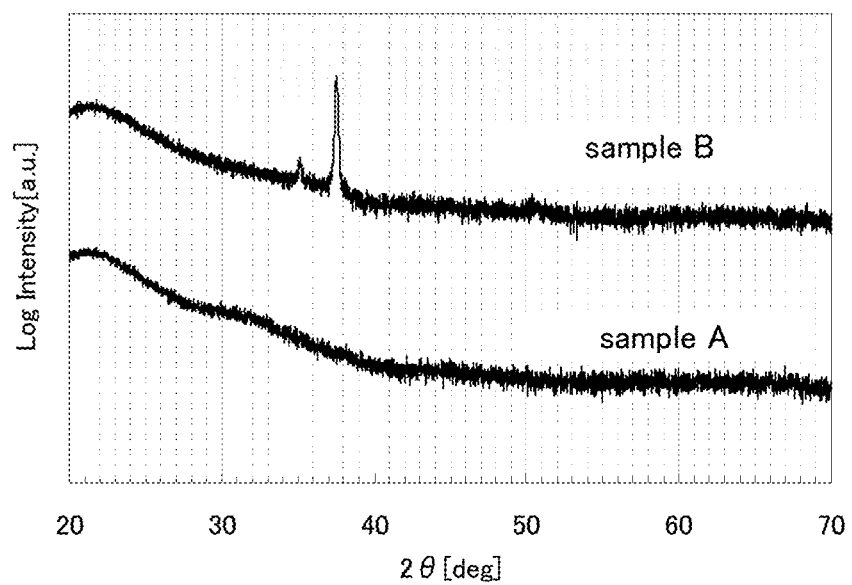
FIG. 23 shows XRD spectra of oxide materials.

FIG. 23 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current represents current per micrometer of a channel width.

Figure 24:
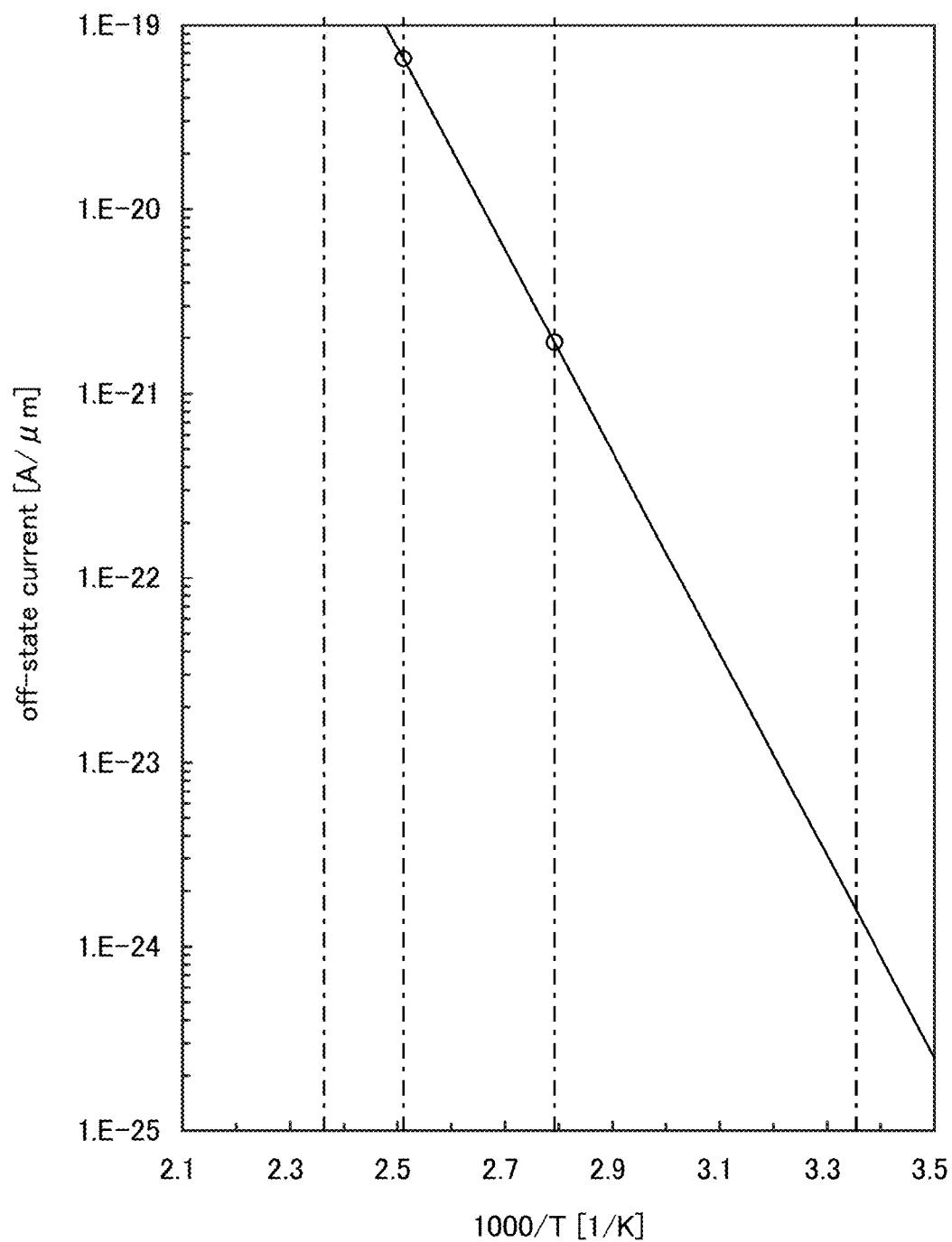
FIG. 24 shows characteristics of a transistor.

FIG. 24 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 24, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-2\circ}$ A/μm) or lower, and 0.1 zA/μm ($1\times10^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 21:
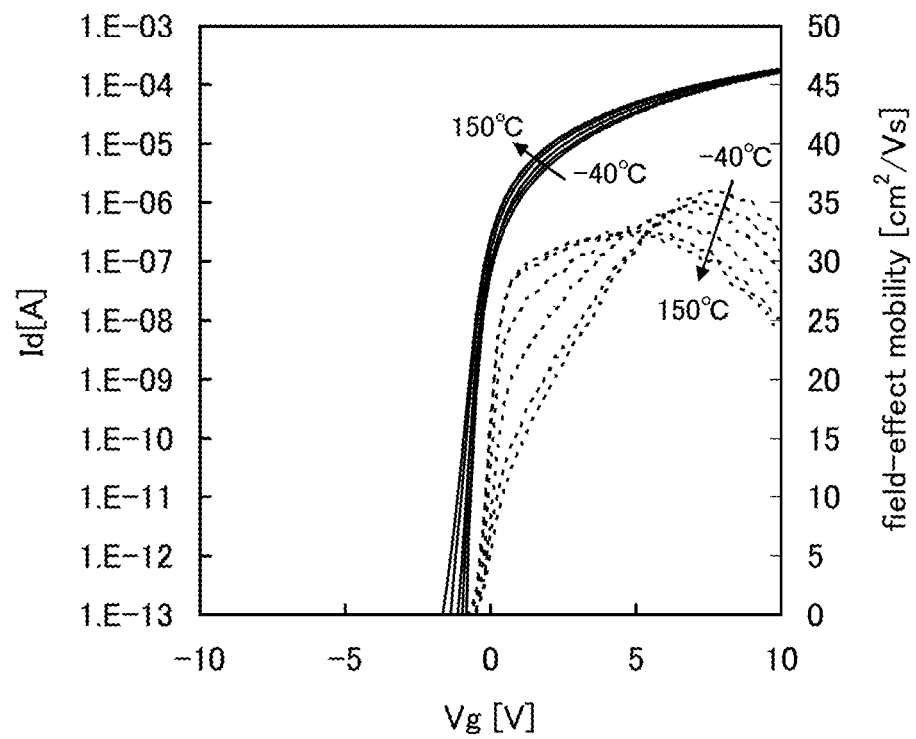
FIG. 21 shows characteristics of a transistor.
Figure 22A:
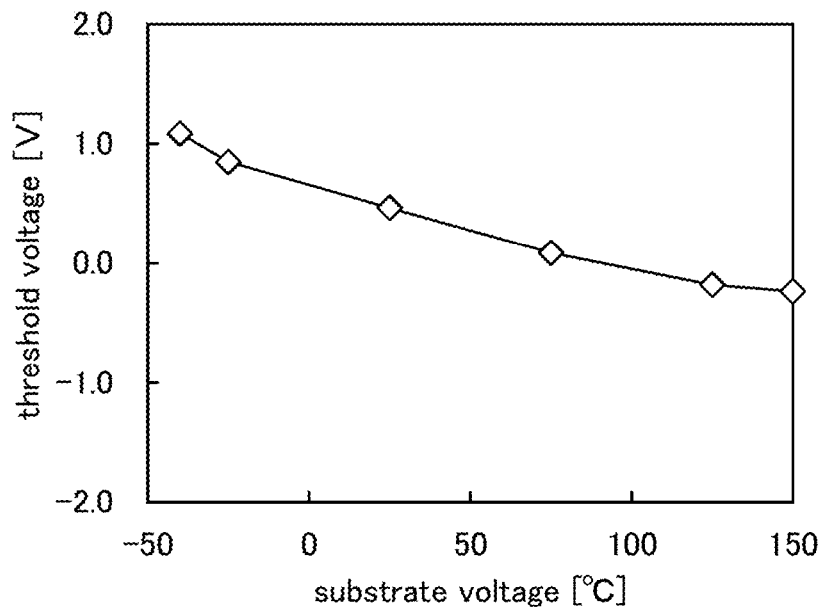
FIGS. 22A and 22B each show characteristics of a transistor.

FIG. 21 shows the $V_g$ dependence of $I_d$ (a solid line) and field-effect mobility (a dotted line). FIG. 22A shows a relation between the substrate temperature and the threshold voltage, and FIG. 22B shows a relation between the substrate temperature and the field-effect mobility.

From FIG. 22A, it is found that the threshold voltage gets lower as the substrate temperature increases. Note that the threshold voltage is decreased from 1.09 V to −0.23 V in the range from −40° C. to 150° C.

Figure 22B:
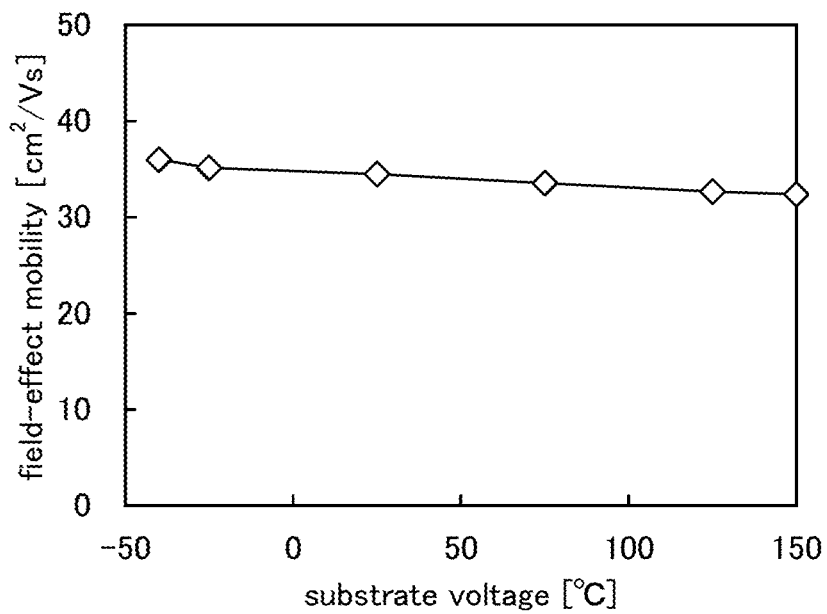

From FIG. 22B, it is found that the field-effect mobility gets lower as the substrate temperature increases. Note that the field-effect mobility is decreased from 36 $cm^2/Vs$ to 32 $cm^2/Vs$ in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 $cm^2/Vsec$ or higher, preferably 40 $cm^2/Vsec$ or higher, further preferably 60 $cm^2/Vsec$ or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

An example of a transistor in which an In—Sn—Zn—O film is used as an oxide semiconductor film will be described below.

Figure 25A:
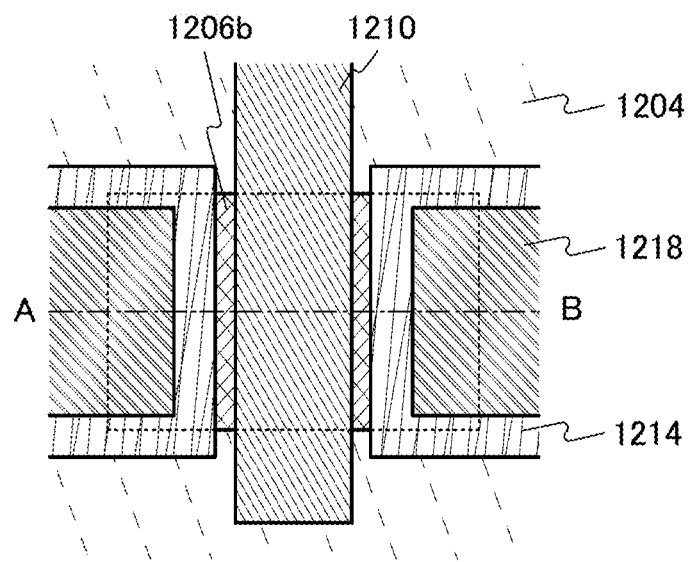
FIGS. 25A and 25B are a cross-sectional view and a plan view of a semiconductor device.
Figure 25B:
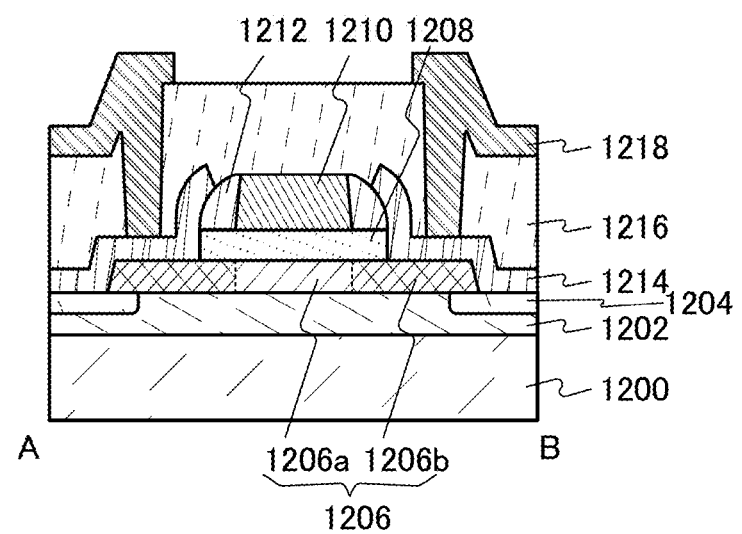

FIGS. 25A and 25B are a top view and a cross-sectional view of a coplanar transistor having a top-gate top-contact structure. FIG. 25A is the top view of the transistor. FIG. 25B shows cross section A-B along dashed-dotted line A-B in FIG. 25A.

The transistor illustrated in FIG. 25B includes a substrate 1200; a base insulating layer 1202 provided over the substrate 1200; a protective insulating film 1204 provided in the periphery of the base insulating layer 1202; an oxide semiconductor film 1206 that is provided over the base insulating layer 1202 and the protective insulating film 1204 and includes a high-resistance region 1206a and low-resistance regions 1206b; a gate insulating layer 1208 provided over the oxide semiconductor film 1206; a gate electrode 1210 provided to overlap with the oxide semiconductor film 1206 with the gate insulating layer 1208 provided therebetween; a sidewall insulating film 1212 provided in contact with a side surface of the gate electrode 1210; a pair of electrodes 1214 provided in contact with at least the low-resistance regions 1206b; an interlayer insulating film 1216 provided to cover at least the oxide semiconductor film 1206, the gate electrode 1210, and the pair of electrodes 1214; and a wiring 1218 provided to be connected to at least one of the pair of electrodes 1214 through an opening formed in the interlayer insulating film 1216.

Although not illustrated, a protective film may be provided to cover the interlayer insulating film 1216 and the wiring 1218. With the protective film, a minute amount of leakage current generated by surface conduction of the interlayer insulating film 1216 can be reduced and thus the off-state current of the transistor can be reduced.

Another example of a transistor in which an In—Sn—Zn—O film is used as an oxide semiconductor film will be described below.

Figure 26A:
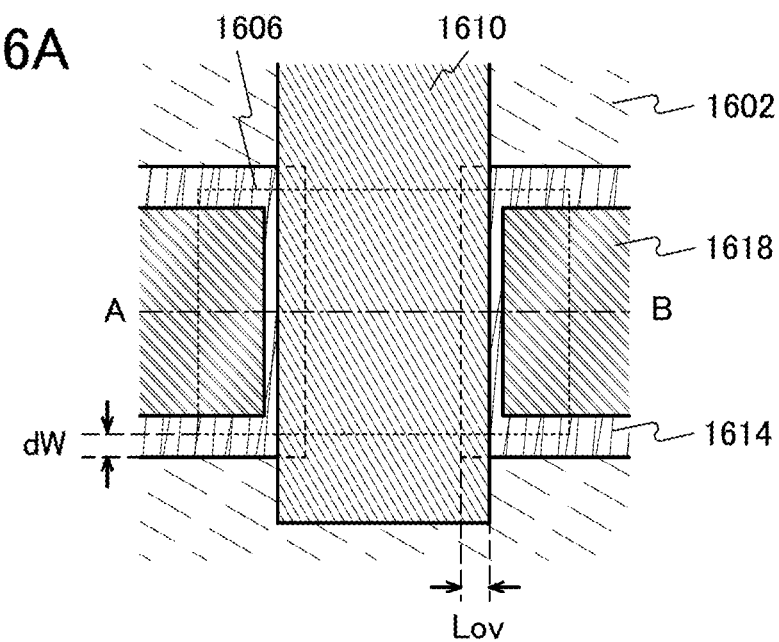
FIGS. 26A and 26B are a cross-sectional view and a plan view of a semiconductor device.
Figure 26B:
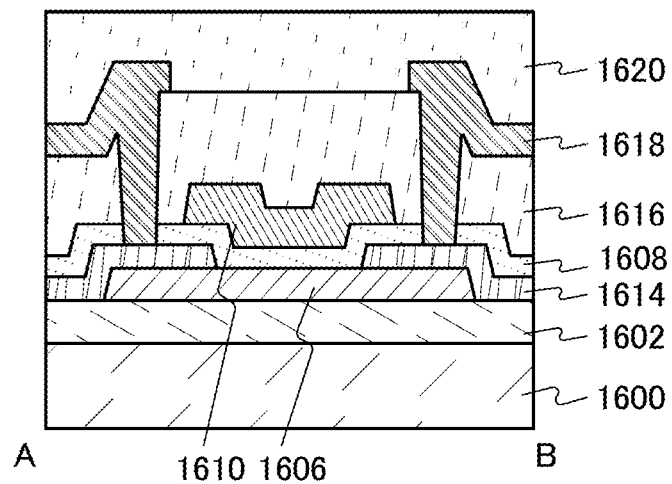

FIGS. 26A and 26B are a top view and a cross-sectional view illustrating a structure of a transistor. FIG. 26A is the top view of the transistor. FIG. 26B is a cross-sectional view along dashed-dotted line A-B in FIG. 26A.

The transistor illustrated in FIG. 26B includes a substrate 1600; a base insulating layer 1602 provided over the substrate 1600; an oxide semiconductor film 1606 provided over the base insulating layer 1602; a pair of electrodes 1614 in contact with the oxide semiconductor film 1606; a gate insulating layer 1608 provided over the oxide semiconductor film 1606 and the pair of electrodes 1614; a gate electrode 1610 provided to overlap with the oxide semiconductor film 1606 with the gate insulating layer 1608 provided therebetween; an interlayer insulating film 1616 provided to cover the gate insulating layer 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate can be used. As the base insulating layer 1602, a silicon oxide film can be used. As the oxide semiconductor film 1606, an In—Sn—Zn—O film can be used. As the pair of electrodes 1614, a tungsten film can be used. As the gate insulating layer 1608, a silicon oxide film can be used. The gate electrode 1610 can have a stacked structure of a tantalum nitride film and a tungsten film. The interlayer insulating film 1616 can have a stacked structure of a silicon oxynitride film and a polyimide film. The wirings 1618 can each have a stacked structure in which a titanium film, an aluminum film, and a titanium film are formed in this order. As the protective film 1620, a polyimide film can be used.

Note that in the transistor having the structure illustrated in FIG. 26A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

Embodiment 9

In this embodiment, examples of electronic devices each including the arithmetic processing unit in the above embodiment are described.

Structure examples of electronic devices in this embodiment are described with reference to FIGS. 9A to 9D.

Figure 9A:
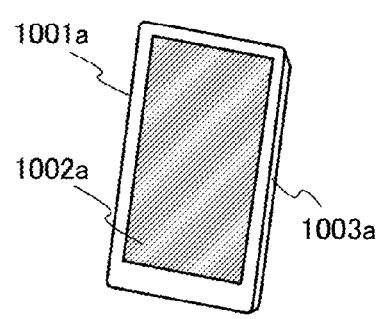
FIGS. 9A to 9D each illustrate an example of an electronic device.

The electronic device illustrated in FIG. 9A is an example of a portable information terminal. The portable information terminal illustrated in FIG. 9A includes a housing 1001a and a display portion 1002a provided in the housing 1001a.

Note that a side surface 1003a of the housing 1001a may be provided with a connection terminal for connecting the portable information terminal to an external device and/or a button for operating the portable information terminal illustrated in FIG. 9A.

The portable information terminal illustrated in FIG. 9A includes a CPU, a memory circuit, an interface for transmitting and receiving a signal between the external device and each of the CPU and the memory circuit, and an antenna for transmitting and receiving a signal to and from the external device, in the housing 1001a.

The portable information terminal illustrated in FIG. 9A serves as one or more of a telephone set, an e-book reader, a personal computer, and a game machine, for example.

Figure 9C:
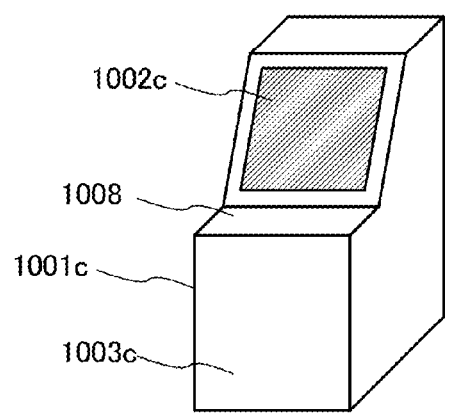
Figure 9B:
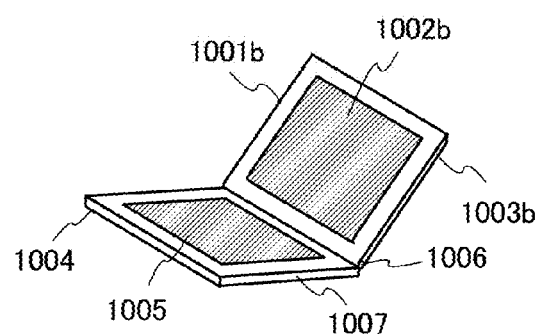

The electronic device illustrated in FIG. 9B is an example of a folding portable information terminal. The portable information terminal illustrated in FIG. 9B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal illustrated in FIG. 9B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal for connecting the portable information terminal to an external device and/or a button for operating the portable information terminal illustrated in FIG. 9B.

The display portion 1002b and the display portion 1005 may display different images or one image. Note that the display portion 1005 is not necessarily provided, and a keyboard which is an input device may be provided instead of the display portion 1005.

The portable information terminal illustrated in FIG. 9B includes a CPU, a memory circuit, and an interface for transmitting and receiving a signal between the external device and each of the CPU and the memory circuit in the housing 1001b or the housing 1004. Note that the portable information terminal illustrated in FIG. 9B may include an antenna for transmitting and receiving a signal to and from the external device.

The portable information terminal illustrated in FIG. 9B serves as one or more of a telephone set, an e-book reader, a personal computer, and a game machine, for example.

The electronic device illustrated in FIG. 9C is an example of a stationary information terminal. The stationary information terminal illustrated in FIG. 9C includes a housing 1001c and a display portion 1002c provided in the housing 1001c.

Note that the display portion 1002c can be provided on a deck portion 1008 of the housing 1001c.

The stationary information terminal illustrated in FIG. 9C includes a CPU, a memory circuit, and an interface for transmitting and receiving a signal between the external device and each of the CPU and the memory circuit in the housing 1001c. Note that the stationary information terminal illustrated in FIG. 9C may include an antenna for transmitting and receiving a signal to and from the external device.

Further, a side surface 1003c of the housing 1001c in the stationary information terminal illustrated in FIG. 9C may be provided with one or more of a ticket output portion that outputs a ticket or the like, a coin slot, and a bill slot.

The stationary information terminal illustrated in FIG. 9C serves as an automated teller machine, an information communication terminal (also referred to as a multimedia station) for ordering a ticket or the like, or a game machine, for example.

Figure 9D:
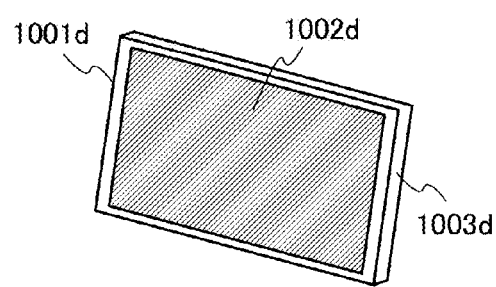

The electronic device illustrated in FIG. 9D is an example of a stationary information terminal. The stationary information terminal illustrated in FIG. 9D includes a housing 1001d and a display portion 1002d provided in the housing 1001d. Note that a support for supporting the housing 1001d may also be provided.

Note that a side surface 1003d of the housing 1001d may be provided with a connection terminal for connecting the stationary information terminal to an external device and/or a button for operating the stationary information terminal illustrated in FIG. 9D.

The stationary information terminal illustrated in FIG. 9D includes a CPU, a memory circuit, and an interface for transmitting and receiving a signal between the external device and each of the CPU and the memory circuit in the housing 1001d. Note that the stationary information terminal illustrated in FIG. 9D may include an antenna for transmitting and receiving a signal to and from the external device.

The stationary information terminal illustrated in FIG. 9D serves as a digital photo frame, a monitor, or a television set, for example.

The arithmetic processing unit in the above embodiment is used as one of the CPUs in the electronic devices illustrated in FIGS. 9A to 9D.

As described with reference to FIGS. 9A to 9D, the examples of the electronic devices in this embodiment each include the arithmetic processing unit in the above embodiment as a CPU.

With such a structure, even when power is not supplied, data in an electronic device can be retained for a certain period. Thus, a time after the supply of the power supply voltage starts until a normal operation starts can be shortened and power consumption can be reduced.

This application is based on Japanese Patent Application serial no. 2011-091582 filed with Japan Patent Office on Apr. 15, 2011 and Japanese Patent Application serial no. 2011-112453 filed with Japan Patent Office on May 19, 2011, the entire contents of which are hereby incorporated by reference.

What is claimed is:

1. A semiconductor device comprising:
   a memory cell comprising:
      a first transistor;
      a second transistor;
      a third transistor;
      a fourth transistor; and
      a fifth transistor,
   wherein a gate of the first transistor is electrically connected to a word line,
   wherein one of a source and a drain of the first transistor is electrically connected to a data line,
   wherein the other of the source and the drain of the first transistor is electrically connected to a gate of the second transistor,
   wherein one of a source and a drain of the second transistor is electrically connected to an output signal line,
   wherein a gate of the third transistor is electrically connected to the data line, wherein one of a source and a drain of the third transistor is electrically connected to the other of the source and the drain of the second transistor, wherein the other of the source and the drain of the first transistor is electrically connected to a gate of the fourth transistor, wherein a gate of the fifth transistor is electrically connected to the data line, wherein one of a source and a drain of the fourth transistor is electrically connected to the other of the source and the drain of the third transistor, wherein one of a source and a drain of the fifth transistor is electrically connected to the other of the source and the drain of the third transistor, and wherein the other of the source and the drain of the fourth transistor is electrically connected to the other of the source and the drain of the fifth transistor.

2. The semiconductor device according to claim 1, wherein a voltage is applied to the other of the source and the drain of the third transistor through a wiring.

3. The semiconductor device according to claim 1, wherein a conductivity type of the second transistor is different from a conductivity type of the third transistor.

4. The semiconductor device according to claim 1, wherein a conductivity type of the fourth transistor is different from a conductivity type of the fifth transistor.

5. The semiconductor device according to claim 1, wherein the first transistor comprises a channel formation region comprising a oxide semiconductor.

6. A semiconductor device comprising:
   memory cells of N stages (N is a natural number greater than or equal to 2) each storing 1-bit data as stored data;
   a first output signal line;
   a second output signal line;
   first to (N−1)th connection wirings; and
   a wiring to which a voltage is applied,
   wherein each of the memory cells of N stages comprises:
      a first comparison circuit configured to perform a first comparison operation between the 1-bit stored data and 1-bit search data;
      a second comparison circuit configured to perform a second comparison operation between the 1-bit stored data and the 1-bit search data; and
      a field-effect transistor configured to control writing and holding of the 1-bit stored data,
   wherein the first comparison circuit of a memory cell in a first stage is configured to control electrical connection between the wiring and the first output signal line in accordance with the first comparison operation,
   wherein the second comparison circuit of the memory cell in the first stage is configured to control electrical connection between the wiring and a first connection wiring in accordance with the second comparison operation,
   wherein the first comparison circuit of a memory cell in a K-th stage (K is a natural number greater than or equal to 2 and less than or equal to N−1) is configured to control electrical connection between a (K−1)th connection wiring and the first output signal line in accordance with the first comparison operation,
   wherein the second comparison circuit of the memory cell in the K-th stage is configured to control electrical connection between the (K−1)th connection wiring and a K-th connection wiring in accordance with the second comparison operation,
   wherein the first comparison circuit of a memory cell in an N-th stage is configured to control electrical connection between an (N−1)th connection wiring and the first output signal line in accordance with the first comparison operation, and
   wherein the second comparison circuit of the memory cell in the N-th stage is configured to control electrical connection between the (N−1)th connection wiring and the second output signal line in accordance with the second comparison operation.

7. The semiconductor device according to claim 6,
wherein the first comparison circuit is configured to take a conduction state when the 1-bit stored data is smaller than the 1-bit search data and a non-conduction state when the 1-bit stored data matches or is larger than the 1-bit search data, and
wherein the second comparison circuit is configured to take a conduction state when the 1-bit stored data matches or is smaller than the 1-bit search data and a non-conduction state when the 1-bit stored data is larger than the 1-bit search data.

8. The semiconductor device according to claim 6:
wherein the first comparison circuit is configured to take a conduction state when the 1-bit stored data is larger than the 1-bit search data and a non-conduction state when the 1-bit stored data matches or is smaller than the 1-bit search data, and
wherein the second comparison circuit is configured to take a conduction state when the 1-bit stored data matches or is larger than the 1-bit search data and a non-conduction state when the 1-bit stored data is smaller than the 1-bit search data.

9. The semiconductor device according to claim 6,
wherein the field-effect transistor comprises an oxide semiconductor layer comprising a channel formation region, the oxide semiconductor layer having a band gap energy of 2.0 eV or more, and
wherein the oxide semiconductor layer comprises a phase which has a triangular, hexagonal, regular triangular, or regular hexagonal atomic arrangement when seen from a direction perpendicular to an a-b plane and in which metal atoms are arranged in a layered manner when seen from a direction perpendicular to a c-axis direction or metal atoms and oxygen atoms are arranged in a layered manner when seen from the direction perpendicular to the c-axis direction.

\* \* \* \* \*